US009595461B2

(12) United States Patent
Takahara et al.

(10) Patent No.: US 9,595,461 B2
(45) Date of Patent: Mar. 14, 2017

(54) STORAGE FACILITY AND STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 393 days.

(21) Appl. No.: 14/307,955

(22) Filed: Jun. 18, 2014

(65) Prior Publication Data

US 2015/0000759 A1     Jan. 1, 2015

(30) Foreign Application Priority Data

Jun. 26, 2013   (JP) .................................. 2013-134269

(51) Int. Cl.
     *H01L 21/677*      (2006.01)
     *F17C 13/02*      (2006.01)
     *H01L 21/673*      (2006.01)

(52) U.S. Cl.
     CPC ........ *H01L 21/67769* (2013.01); *F17C 13/02* (2013.01); *H01L 21/67389* (2013.01); *H01L 21/67393* (2013.01); *F17C 2221/014* (2013.01); *F17C 2227/044* (2013.01); *F17C 2250/032* (2013.01); *F17C 2270/059* (2013.01); *F17C 2270/0518* (2013.01); *Y10T 137/0419* (2015.04); *Y10T 137/4259* (2015.04)

(58) Field of Classification Search
CPC ......... H01L 21/67769; H01L 21/67393; H01L 21/67389

USPC ........................................... 414/217; 700/214
See application file for complete search history.

(56) References Cited

U.S. PATENT DOCUMENTS

| 6,123,120 | A | * | 9/2000 | Yotsumoto | ........ | H01L 21/67389 |
| | | | | | | 141/59 |
| 2008/0156069 | A1 | * | 7/2008 | Murata | .................. | G01D 21/00 |
| | | | | | | 73/19.04 |
| 2010/0000625 | A1 | | 1/2010 | Goto et al. | | |
| 2014/0000757 | A1 | * | 1/2014 | Takahara | .......... | H01L 21/67769 |
| | | | | | | 141/8 |

FOREIGN PATENT DOCUMENTS

| JP | 200973625 A | 4/2009 |
| JP | 201016199 A | 1/2010 |
| JP | 2010182747 A | 8/2010 |

* cited by examiner

*Primary Examiner* — Timothy L Maust
*Assistant Examiner* — Timothy P Kelly
(74) *Attorney, Agent, or Firm* — The Webb Law Firm

(57) ABSTRACT

A storage facility includes a controller for monitoring a supply state of the inactive gas for the plurality of storage sections and for controlling the plurality of supply amount adjusting devices. The controller is configured to monitor the supply state of the inactive gas for the plurality of storage sections by dividing the plurality of storage sections into a plurality of monitoring areas, and to control a plurality of supply amount adjusting devices such that the supply state of the inactive gas supplied to the storage sections belonging to each of the plurality of monitoring areas satisfies a set restricting condition defined in advance.

16 Claims, 11 Drawing Sheets

STORAGE FACILITY AND STORAGE METHOD

CROSS-REFERENCE TO RELATED APPLICATION

This application claims priority to Japanese Patent Application No. 2013-134269 filed Jun. 26, 2013, the disclosure of which is hereby incorporated in its entirety by reference.

FIELD OF THE INVENTION

The present invention relates to a storage facility comprising a plurality of storage sections for storing containers, inactive gas supply passages for supplying inactive gas to respective ones of the plurality of storage sections, an inject portion provided to each of the plurality of storage sections for injecting inactive gas supplied from the inactive gas supply passage to an interior of the container stored in the storage section, and a discharge portion provided to each of the plurality of storage sections for discharging gas within the container to outside the container when the inactive gas is injected from the inject portion to the interior of the container stored in the storage section. The present invention also relates to a storage method that utilizes such a storage facility.

BACKGROUND

JP Publication of Application No. 2010-16199 (Patent Document 1) discloses an example of a storage facility such as one described above. The facility of Patent Document 1 includes a plurality of storage sections for storing containers, and inactive gas supply passages each of which supplies inactive gas, such as nitrogen gas and gaseous argon, to the corresponding one of the plurality of storage sections. And the inactive gas is supplied to an inject portion through the inactive gas supply passage, and the inactive gas is injected from the inject portion into the container to supply the inactive gas to the interior of the container stored in a storage section.

In the storage facility of Patent Document 1 described above, problems, such as an occurrence of oxidization etc. of the semiconductor substrates stored in the containers are alleviated by supplying inactive gas into the container when the container is stored in a storage section, and thereby discharging oxygen gas, and vapor, etc., which are not beneficial in controlling the quality of the semiconductor substrates, to the exterior of the container from a discharge portion.

Thus, a storage facility is known which would help prevent quality degradation of the articles in containers by supplying inactive gas into the containers stored in storage sections thereby removing the gas previously existed in the containers.

SUMMARY OF THE INVENTION

When inactive gas is supplied into a container stored in a storage section, the gas which existed within the container is discharged from the container as the inactive gas is supplied into the container. The gas discharged from the container in this manner is discharged into the storage section, in which the container is stored, directly from the discharge opening of the container, or through a gap between the container and its lid. As the supplying of the inactive gas into the container is continued, the inactive gas is discharged into the storage section as the gas in the container is replaced by the inactive gas.

And when inactive gas is supplied to two or more storage sections, and if those storage sections are located close together, the inactive gas is discharged into the storage sections that are close together with the result that the concentration of inactive gas becomes high locally. In other words, the oxygen concentration becomes low locally.

Incidentally, it is desired in such a storage facility to reduce any decrease in the oxygen concentration in consideration of the effects on, for example, workers who work in the area. To this end, arrangements are sometimes made in which a sensor, which detects the oxygen concentration in the space where the storage sections are installed, is provided, and in which the supply of the inactive gas to the plurality of storage sections is stopped if the oxygen concentration in the installation space becomes less than or equal to a set value.

However, with such arrangements, the supply of the inactive gas is stopped if the oxygen concentration decreases locally in the location in which the sensor is provided, even if the oxygen concentration is not so low over the entire installation space; therefore, there is a disadvantage that the supply of inactive gas is stopped more often than necessary.

Thus, it is desired to reduce the occurrences in which the concentration of inactive gas becomes high locally.

Thus, a storage facility is desired in which the concentration of inactive gas is kept from becoming high locally in the space in which the storage sections are installed.

A storage facility in accordance with the present invention comprises: a plurality of storage sections for storing containers; inactive gas supply passages for supplying inactive gas to respective ones of the plurality of storage sections; an inject portion provided to each of the plurality of storage sections for injecting inactive gas supplied from the inactive gas supply passage to an interior of the container stored in the storage section; a discharge portion provided to each of the plurality of storage sections for discharging gas within the container to outside the container when the inactive gas is injected from the inject portion to the interior of the container stored in the storage section; a plurality of supply amount adjusting devices, each of which is provided on an upstream side, in the inactive gas supply passage, of the inject portion of a corresponding one of the plurality of storage sections, for adjusting a supply amount of the inactive gas to the corresponding inject portion; a controller for monitoring a supply state of the inactive gas for the plurality of storage sections and for controlling the plurality of supply amount adjusting devices; wherein the controller is configured to monitor the supply state of the inactive gas for the plurality of storage sections by dividing the plurality of storage sections into a plurality of monitoring areas defined for each of groups of storage sections each of which consists of two or more storage sections with one located next to another, and to control the plurality of supply amount adjusting devices such that the supply state of the inactive gas supplied to the storage sections belonging to each of the plurality of monitoring areas satisfies a set restricting condition defined in advance.

With the arrangement described above, the controller controls the plurality of supply amount adjusting devices such that the supply state of the inactive gas to the storage sections belonging to each of the plurality of monitoring areas satisfies the set restricting condition defined in advance.

The set restricting condition may be, for example, that the total supply amount of the inactive gas to a group of storage sections belonging to a monitoring area is less than or equal to below to a set value, or that the number of the storage sections, to which the inactive gas is supplied in the group of the storage sections belonging to a monitoring area, is less than or equal to a set total number, or that the number of consecutive storage sections, to which the inactive gas is supplied in the group of the storage sections belonging to a monitoring area, is less than or equal to a set consecutive number.

By supplying the inactive gas to each of the plurality of monitoring areas defined for each group of storage sections which consists of two or more storage sections with one located next to another such that the set restricting condition defined in advance, as described above, is satisfied, the amount of the inactive gas supplied to the group of storage sections belonging to any given monitoring area may be reduced. This can help keep the concentration of inactive gas from becoming high locally to the extent that it poses a problem in the installation space in which the storage sections are installed.

Incidentally, the inactive gas, that is no longer destined to a given monitoring area as the result of the reduction in the supply amount, is supplied to a group of the storage sections that belongs to another monitoring area; thus, the arrangement above also helps in an attempt to equalize the concentration of inactive gas over a wider area by dispersing the supply of the inactive gas over a number of storage sections.

The technical features of the storage facility in accordance with the present invention also apply to a storage method; and such method falls within the scope of protection of the present invention. The storage method also has the functions and effects of the storage facility.

More specifically, a storage method in accordance with the present invention is a method that utilizes a storage facility including a plurality of storage sections for storing containers;

inactive gas supply passages for supplying inactive gas to respective ones of the plurality of storage sections;

an inject portion provided to each of the plurality of storage sections for injecting inactive gas supplied from the inactive gas supply passage to an interior of the container stored in the storage section;

a discharge portion provided to each of the plurality of storage sections for discharging gas within the container to outside the container when the inactive gas is injected from the inject portion to the interior of the container stored in the storage section;

a plurality of supply amount adjusting devices, each of which is provided on an upstream side, in the inactive gas supply passage, of the inject portion of a corresponding one of the plurality of storage sections, for adjusting a supply amount of the inactive gas to the corresponding inject portion; and the storage method comprising the following steps that are performed by the controller: a supply state monitoring step in which a supply state of the inactive gas is monitored, for the plurality of storage units; an adjusting device controlling step in which the plurality of supply amount adjusting devices are controlled; wherein, in the supply state monitoring step, the supply state of the inactive gas for the plurality of storage sections is monitored by dividing the plurality of storage sections into a plurality of monitoring areas defined for each of groups of storage sections each of which consists of two or more storage sections with one located next to another, and wherein, in the adjusting device controlling step, the plurality of supply amount adjusting devices are controlled such that the supply state of the inactive gas supplied to the storage sections belonging to each of the plurality of monitoring areas satisfies a set restricting condition defined in advance.

Examples of preferred embodiments of the present invention are described next.

In an embodiment of the storage facility in accordance with the present invention, the set restricting condition is preferably a condition defined to restrict a supply amount of the inactive gas per unit time in each of the monitoring areas to less than or equal to a limit value defined in advance.

With the arrangement describe above, the amount of the inactive gas supplied to the group of storage sections that belong to each of the plurality of the monitoring areas per unit time is restricted to less than or equal to the limit value. Thus, the amount of the inactive gas discharged in each monitoring area can be reduced so that local increase in concentration of the inactive gas may be reduced.

In an embodiment of the storage facility in accordance with the present invention, a passage for a worker is preferably provided adjacent to the plurality of storage sections, wherein the plurality of the monitoring areas are preferably defined such that more than one of the monitoring areas are arranged in the direction along which the passage for a worker extends.

With the arrangement described above, more than one monitoring areas are arranged in the direction along which the passage for a worker extends. And inactive gas is supplied to each of the more than one monitoring areas such that the set restricting condition defined in advance is satisfied. Thus, the inactive gas is supplied such as to disperse the inactive gas in the direction to which the passage for a worker extends; which helps reduce any effects of the inactive gas on anyone who may walk in the passage for a worker.

In an embodiment of the storage facility in accordance with the present invention, the plurality of storage sections are preferably provided such that more than one storage sections are arranged in each of a vertical direction and a lateral direction, wherein each of the monitoring areas is preferably defined for the group of storage sections which consists of two or more storage sections with one located next to another in at least one of the vertical direction and the lateral direction.

With the arrangement described above, since more than one storage sections are arranged in each of a vertical direction and a lateral direction, container storage efficiency can be improved.

Each group of storage sections, that belong to a monitoring area, consists of two or more storage sections with one located next to another in the vertical direction or in the lateral direction. Thus, the groups of the storage sections can be located close together.

By supplying the inactive gas to the groups of the storage sections that are located close together such that the set restricting condition defined in advance is satisfied, the arrangement helps keep the concentration of inactive gas from becoming high locally.

In an embodiment of the storage facility in accordance with the present invention, each of the monitoring areas is preferably defined for the group of storage sections which consists of two or more storage sections with one located next to another in a line in the vertical direction.

If the specific gravity of the inactive gas is large (i.e., specific gravity is greater than that of air), the inactive gas discharged from the container in a storage section would flow downwardly. And when this happens, this downward flowing inactive gas may mix with the inactive gas discharged in the storage section located below the first storage section, resulting in a possibility that the concentration of the inactive gas becomes high. The same is true when inactive gas flows downwardly by virtue of the fact that the air current is intentionally generated that causes downflow in the installation space in which the plurality of storage sections are provided.

However, with the arrangement described above, the amount of inactive gas supplied to the plurality of storage sections can be restricted for each column in which a group of storage sections are arranged in the vertical direction; thus, the arrangement helps keep the concentration of inactive gas from becoming high locally even if the inactive gas flows downwardly as described above.

In an embodiment of the storage facility in accordance with the present invention, the set restricting condition is preferably that a total number of the storage sections to which inactive gas is supplied in each of the monitoring areas is less than or equal to a set total number defined in advance.

With the arrangement describe above, the total number of the storage sections to which inactive gas is supplied in each of the monitoring areas is kept less than or equal to the set total number. This set total number can be defined, for example, in consideration of the amount of the inactive gas discharged per unit time in one storage section. Thus, the amount of the inactive gas discharged in each monitoring area can be reduced, which helps keep the concentration of inactive gas from becoming high locally.

In an embodiment of the storage facility in accordance with the present invention, the set restricting condition is preferably that a number of consecutive storage sections to which the inactive gas is supplied in at least one of the vertical direction and the lateral direction is less than or equal to a set consecutive number defined in advance.

With the arrangement described above, the number of consecutive storage sections to which the inactive gas is supplied is kept less than or equal to the set consecutive number. Thus, discharged inactive gas can be dispersed within the monitoring area while reducing the amount of the inactive gas discharged in each monitoring area, which helps keep the concentration of the inactive gas from becoming high locally.

In an embodiment of the storage facility in accordance with the present invention, the controller is configured: to perform a supply process in which the supply amount adjusting device is controlled to supply inactive gas to the storage section provided that the container is stored in the storage section;

a supply stop process in which the supply amount adjusting devices are controlled to stop supplying of the inactive gas to a part of or all of the plurality of storage sections; and to perform, after performing the supply stop process, a supply resume process in which the supply amount adjusting devices are controlled to supply the inactive gas to the storage sections to which the supplying of the inactive gas is to be resumed among the storage sections to which the supplying of inactive gas has been stopped in the supply stop process; and wherein, in the supply resume process, a part of or all of the storage sections are preferably selected, as storage sections to which the supplying is to be resumed, from all the storage sections which can be the storage sections to which the supplying is to be resumed, such that the set restricting condition is satisfied in the monitoring area that the storage sections to which the supplying is to be resumed belong to if the supplying of the inactive gas is resumed to the storage sections to which the supplying is to be resumed.

With the arrangement described above, the controller is configured to perform the supply stop process and to subsequently perform the supply resume process. To describe this using a specific example in which a sensor, for detecting the oxygen concentration in the installation space in which the storage sections are installed, is provided, if the oxygen concentration in the installation space falls to less than or equal to a set value, the supply stop process is performed to stop the supply of the inactive gas to a part of or all of the plurality of storage sections. Subsequently, when the situation improves to the point where the oxygen concentration of installation space exceeds the set value, the supply resume process may be performed based on the permission command issued manually or automatically to supply inactive gas to the storage sections to which the supplying of inactive gas has been stopped.

In such a situation, if there is a large number of storage sections to which the supplying of inactive gas is resumed in the supply resume process, and if the large number of storage sections are located close together in one area, there is a possibility that the concentration of inactive gas becomes high locally as the result of the inactive gas being discharged in those storage sections, which may cause the concentration of oxygen to decrease locally.

However, with the arrangement described above, in the supply resume process, a part of or all of the storage sections are selected from all of those which can be the storage sections to which the supplying (of inactive gas) is to be resumed such that the restricting condition is satisfied in the monitoring areas. And inactive gas is supplied to the selected storage section to which the supplying is to be resumed while the inactive gas is not supplied to those which are not selected, and not designated, as the storage sections to which the supplying is to be resumed. Thus, the concentration of inactive gas can be prevented from becoming high locally even if the supply resume process is performed.

In an embodiment of the storage facility in accordance with the present invention, the controller is preferably configured to manage elapsed time since storing of the container, for each of the plurality of storage sections, and to select, in the supply resume process, the storage sections to which the supplying is to be resumed from all the storage sections which can be the storage sections to which the supplying is to be resumed by giving priority to the storage sections for which the elapsed time is shorter.

For example, for a container for which the elapsed time since the container is stored in the storage section is long, there would have been enough time for supplying inactive gas; thus, sufficient amount of inactive gas has likely been supplied to the container. However, for a container for which the elapsed time since the container is stored in the storage section is shorter, there would not have been enough time for supplying inactive gas; thus, it is likely that sufficient amount of inactive gas has not been supplied to the container.

Thus, inactive gas can be promptly supplied to the containers for which inactive gas is likely not sufficiently supplied by giving priority to the storage sections for which the elapsed time is shorter in selecting the storage sections as storage sections to which the supplying is to be resumed and by supplying the inactive gas to those selected storage sections.

In an embodiment of the storage facility in accordance with the present invention, walls are preferably provided to enclose installation space in which the plurality of storage sections are installed.

With the arrangement described above, inactive gas can be prevented from flowing to outside the walls, or the inactive gas can be allowed to flow to outside through a predetermined location even if the inactive gas is allowed to flow to outside the walls; thus, it is easy to manage, or monitor, the discharging condition of the inactive gas when inactive gas is allowed to be discharged to outside the installation space.

In an embodiment of the storage method in accordance with the present invention, the set restricting condition is preferably a condition defined to restrict a supply amount of the inactive gas per unit time in each of the monitoring areas to less than or equal to a limit value defined in advance.

In an embodiment of the storage method in accordance with the present invention, the storage facility preferably has a passage for a worker, the passage being provided adjacent to the plurality of storage sections, wherein, in the supply state monitoring step, the plurality of the monitoring areas are preferably defined such that more than one of the monitoring areas are arranged in the direction along which the passage for a worker extends.

In an embodiment of the storage method in accordance with the present invention, the plurality of storage sections are preferably provided such that more than one storage sections are arranged in each of a vertical direction and a lateral direction, wherein, in the supply state monitoring step, each of the monitoring areas is preferably defined for the group of storage sections which consists of two or more storage sections with one located next to another in at least one of the vertical direction and the lateral direction.

In an embodiment of the storage method in accordance with the present invention, in the supply state monitoring step, each of the monitoring areas is preferably defined for the group of storage sections which consists of two or more storage sections with one located next to another in a line in the vertical direction.

In an embodiment of the storage method in accordance with the present invention, the set restricting condition is preferably that a total number of the storage sections to which inactive gas is supplied in each of the monitoring areas is less than or equal to a set total number defined in advance.

In an embodiment of the storage method in accordance with the present invention, the set restricting condition is preferably that a number of consecutive storage sections to which the inactive gas is supplied in at least one of the vertical direction and the lateral direction is less than or equal to a set consecutive number defined in advance.

In an embodiment of the storage method in accordance with the present invention, in the adjusting device controlling step, the following processes are preferably performed:

a supply process in which the supply amount adjusting device is controlled to supply inactive gas to the storage section provided that the container is stored in the storage section;

a supply stop process in which the supply amount adjusting devices are controlled to stop supplying of the inactive gas to a part of or all of the plurality of storage sections; and after performing the supply stop process, a supply resume process in which the supply amount adjusting devices are controlled to supply the inactive gas to the storage sections to which the supplying of the inactive gas is to be resumed among the storage sections to which the supplying of inactive gas has been stopped in the supply stop process; and wherein, in the supply resume process, a part of or all of the storage sections are preferably selected, as storage sections to which the supplying is to be resumed, from all the storage sections which can be the storage sections to which the supplying is to be resumed, such that the set restricting condition is satisfied in the monitoring area that the storage sections to which the supplying is to be resumed belong to when the supplying of the inactive gas is resumed to the storage sections to which the supplying is to be resumed.

In an embodiment of the storage method in accordance with the present invention, the steps that are performed by the controller preferably further includes an elapsed time managing step in which elapsed time since storing of the container is managed, for each of the plurality of storage sections, wherein, in the supply resume process, the storage sections to which the supplying is to be resumed are preferably selected from all the storage sections which can be the storage sections to which the supplying is to be resumed, by giving priority to the storage sections for which the elapsed time is shorter.

In an embodiment of the storage method in accordance with the present invention, the storage facility preferably includes walls that are provided to enclose installation space in which the plurality of storage sections are installed.

DETAILED DESCRIPTION

The embodiment of the present invention is described next with reference to the drawings.

Figure 1:
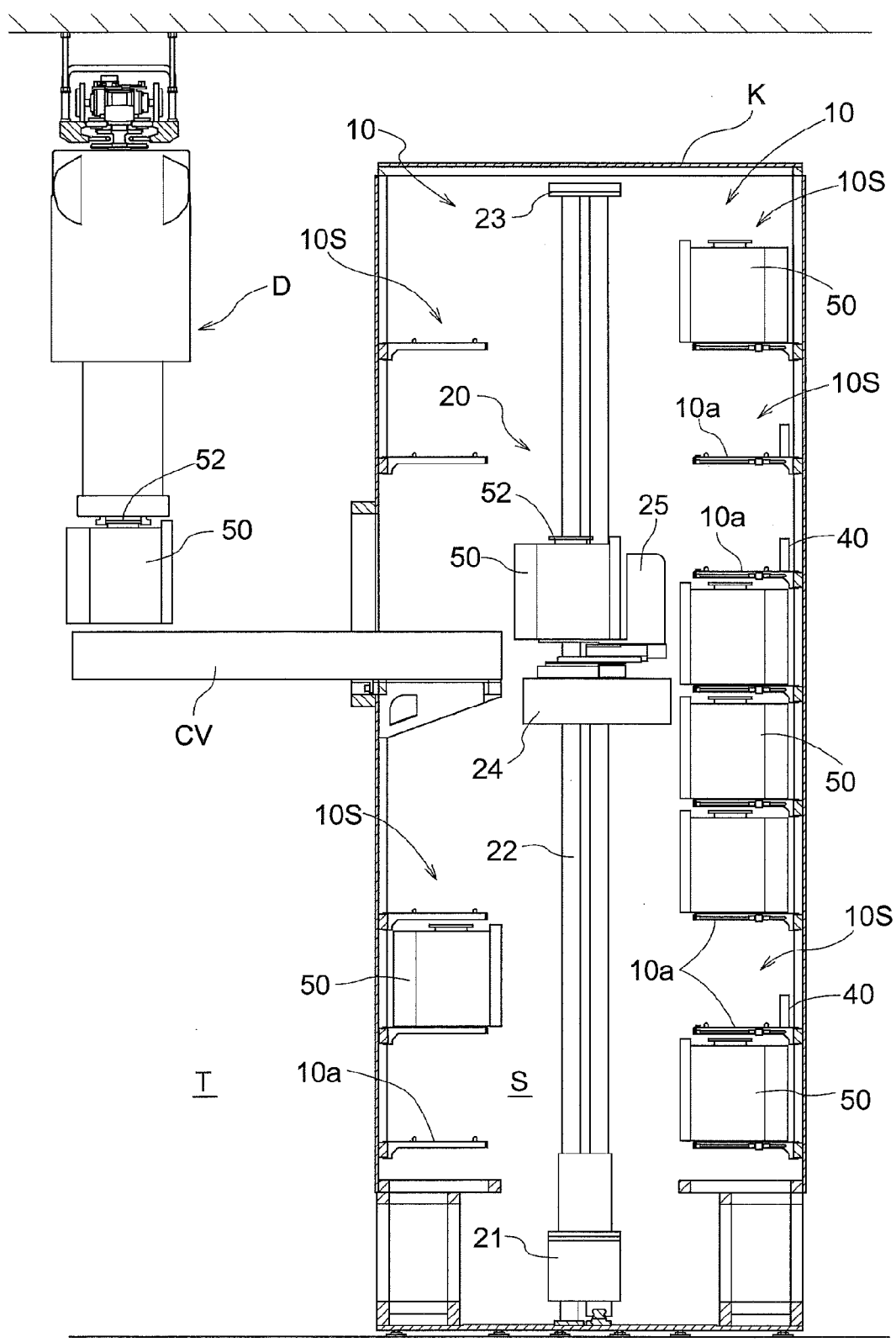
FIG. 1 is a vertical sectional side view of a storage facility.

As shown in FIG. 1, the storage facility includes a storage rack 10 having a plurality of storage sections 10S each of which is configured to store a container 50, a stacker crane 20 which transports the containers 50 one at a time, walls K which cover the installation space S in which the storage rack 10 including the plurality of storage sections 10S and the stacker crane 20 are installed, and a carry in and out conveyor CV which extends through one of the walls K and which supports and transports the containers 50. Each container 50 stores substrates W in a sealed environment.

Note that a pair of storage racks 10 are provided such that they face each other. In the present embodiment, the substrates W are semiconductor wafers, and each container 50 is a FOUP (Front Opening Unified Pod) for storing semiconductor wafers.

The storage facility is configured such that clean air is caused to flow downwardly (downflow) from the upper area in the installation space S and such that the downflow air that reached the lower area of the installation space S is discharged laterally from the storage facility through a discharge opening (not shown) formed in a lower portion of the wall K. This arrangement reduces the concentration of nitrogen gas in the installation space S and also helps clean, or maintain the clean environment in, the installation space S.

In addition, a passage for a worker T (or a worker passage for short) in which a worker can walk is formed laterally next or adjacent to one of the walls K. This worker passage T is formed to extend along the longitudinal direction (i.e., lateral, or right and left direction) of the storage rack 10. Thus, the worker passage T is provided adjacent to the plurality of storage sections 10S. And one of the walls K is located between the plurality of storage sections 10S and the worker passage T. Here, the longitudinal direction of the storage rack 10 is the lateral (or right and left) direction of the storage rack 10.

(Structure of the Container 50)

Figure 4:
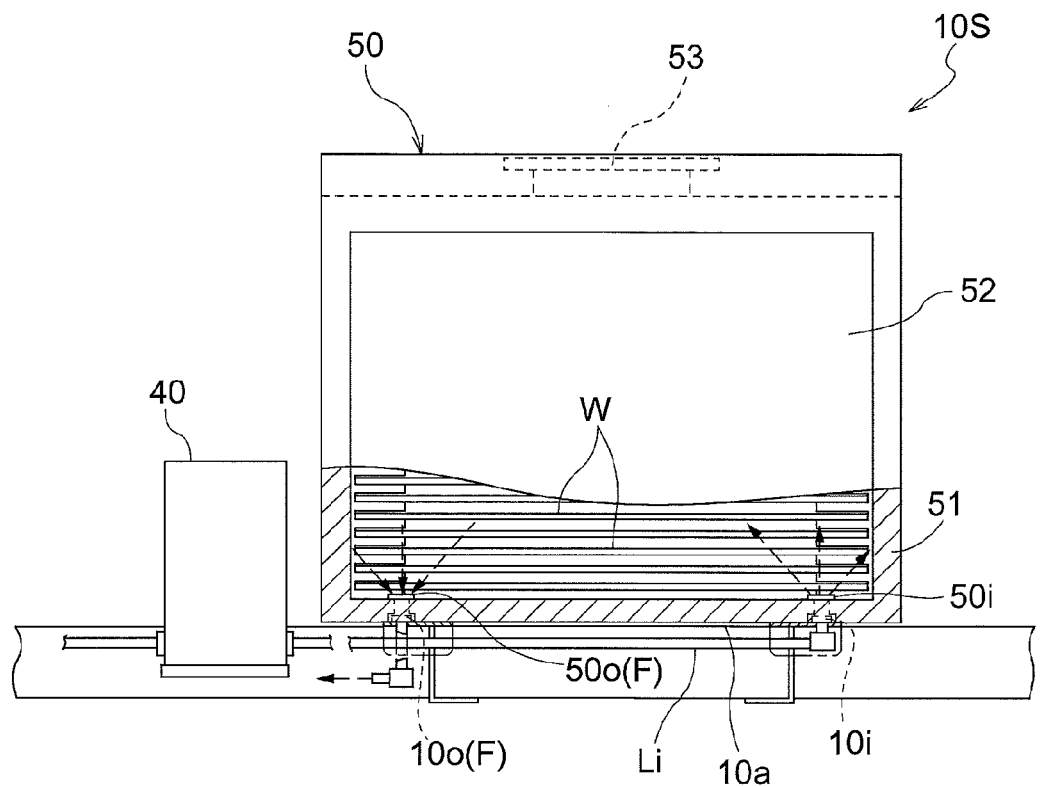
FIG. 4 is a front view of the storage section.
Figure 4:
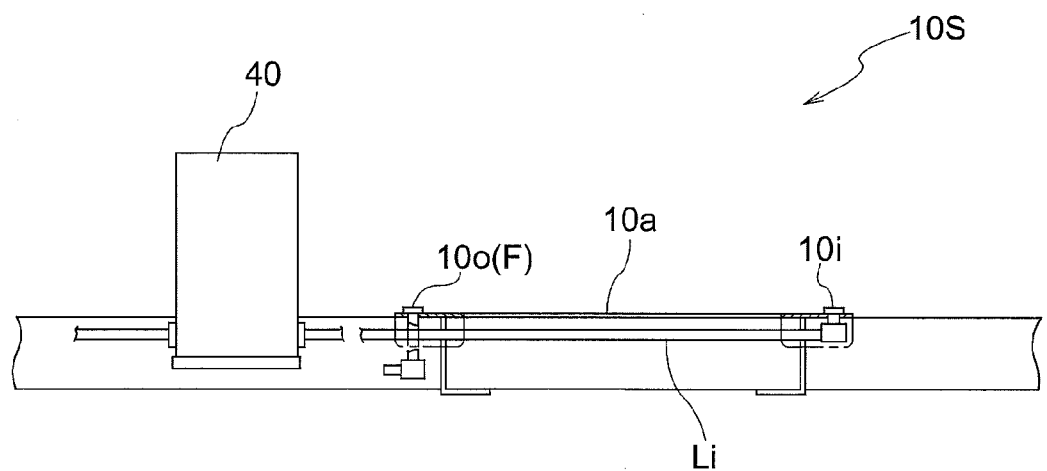

As shown in FIG. 4, each container 50 includes a casing 51 having an opening for inserting and retrieving the substrates W, and a detachable lid 52 which closes the opening of the casing 51 when attached to the casing 51.

Figure 2:
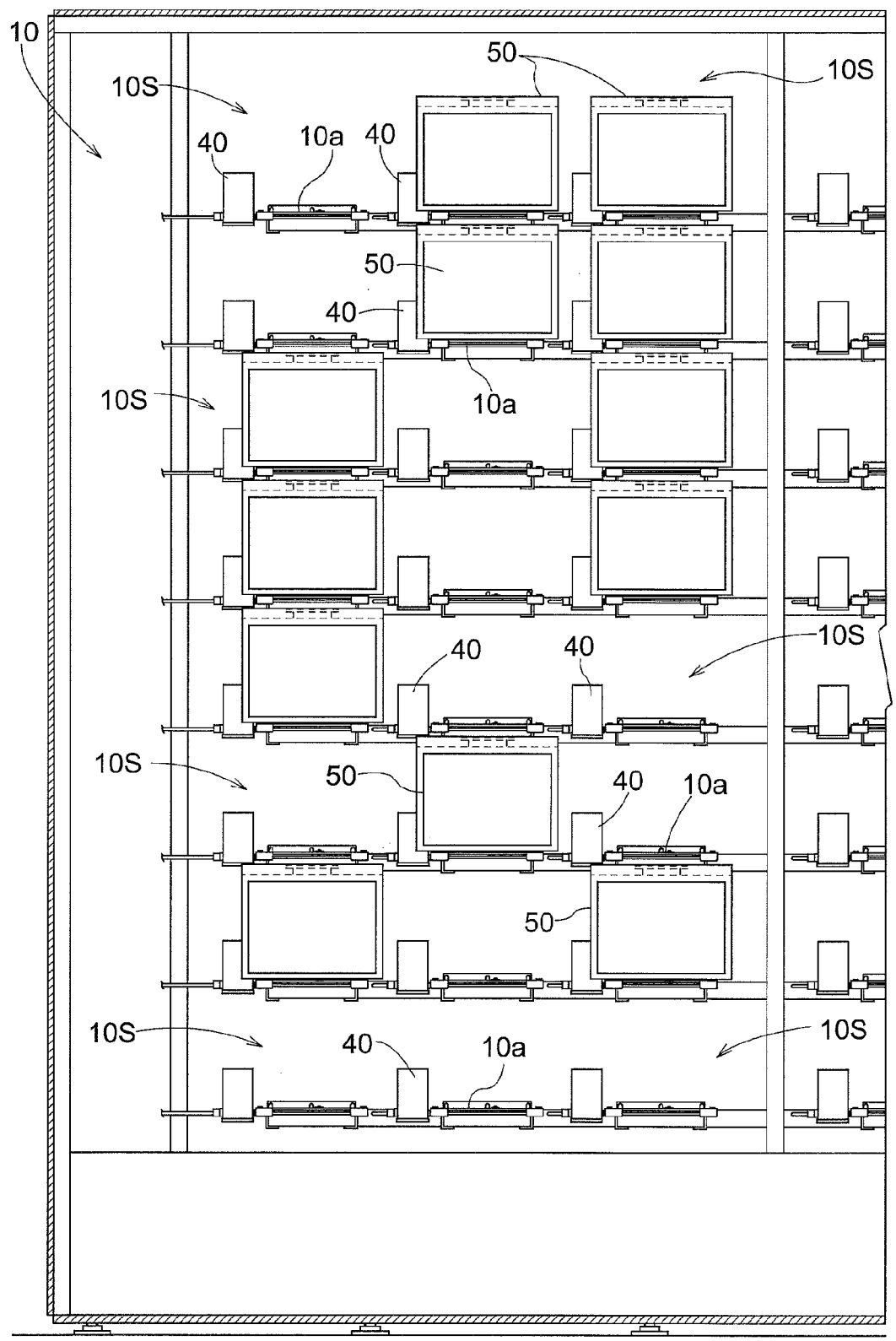
FIG. 2 is a vertical sectional front view showing a part of the facility.

As shown in FIGS. 1, 2, and 4, a top flange 53, configured to be gripped by a hoist type transport vehicle D, is formed in the top surface of the casing 51. In addition, a gas supply opening 50$i$ for introducing nitrogen gas, which functions as inactive gas, into the container 50, as well as a discharge opening 50$o$ for discharging nitrogen gas out of the container 50 are formed in the bottom surface of the casing 51. While not shown, the gas supply opening 50$i$ is provided with an introducing side opening and closing valve whereas the discharge opening 50$o$ is provided with a discharging side opening and closing valve.

Thus, the container 50 is configured to gain and maintain its airtightness by closing the opening by means of the lid 52 with the substrates W stored within the container 50, and by closing each of the gas supply opening 50$i$ and the discharge opening 50$o$ with respective opening and closing valves.

The introducing side opening and closing valve of the gas supply opening 50$i$ is urged in a valve closing direction, or toward its closed position, by an urging member, such as a spring. And when the inject pressure of the nitrogen gas supplied to the gas supply opening 50$i$ becomes greater than or equal to a set valve opening pressure which is greater than the atmospheric pressure, the introducing side opening and closing valve of the gas supply opening 50$i$ is opened by that inject pressure.

Also, the discharging side opening and closing valve of the discharge opening 50$o$ is urged in a valve closing direction, or toward its closed position, by an urging member, such as a spring. And when the pressure inside the container 50 becomes greater than or equal to a set valve opening pressure which is greater than the atmospheric pressure, the discharge side opening and closing valve of the discharge opening 50$o$ is opened by that pressure.

(Structure of the Stacker Crane 20)

As shown in FIG. 1, the stacker crane 20 includes a travel carriage 21 which is configured to travel on the front side of the storage rack 10 and along the longitudinal direction (lateral direction) of the storage rack 10, a mast 22 provided to stand vertically on the travel carriage 21, an upper frame 23 which is provided in an upper end of the mast 22 and which engages with an upper guide rail (not shown), and a vertically movable platform 24 which can be moved vertically, or up and down, while being guided by the mast 22.

A transfer device 25 for transferring the container 50 to or from a storage section 10S and to or from the carry in and out conveyor CV is mounted on the vertically movable platform 24.

And the stacker crane 20 transports the container 50 between the carry in and out conveyor CV and the plurality of storage sections 10S by the travel operation of the travel carriage 21, vertical movement operation of the vertically movable platform 24, and transfer operation of the transfer device 25.

(Structure of the Storage Section 10S)

As shown in FIG. 2, a plurality of storage sections 10S in the storage rack 10 are arranged both in the vertical direction and in the lateral direction. To describe in more detail, the storage sections 10S are arranged in the storage rack 10 in the present example such as to form eight rows of storage sections 10S arranged in the vertical direction (i.e., with one row located on top of another) and nine columns (of which only four columns are shown in FIG. 2) of storage sections 10S arranged (i.e., with one column located next to another) in the lateral direction so that the storage sections 10S are provided at 72 locations in the storage rack 10.

Figure 5:
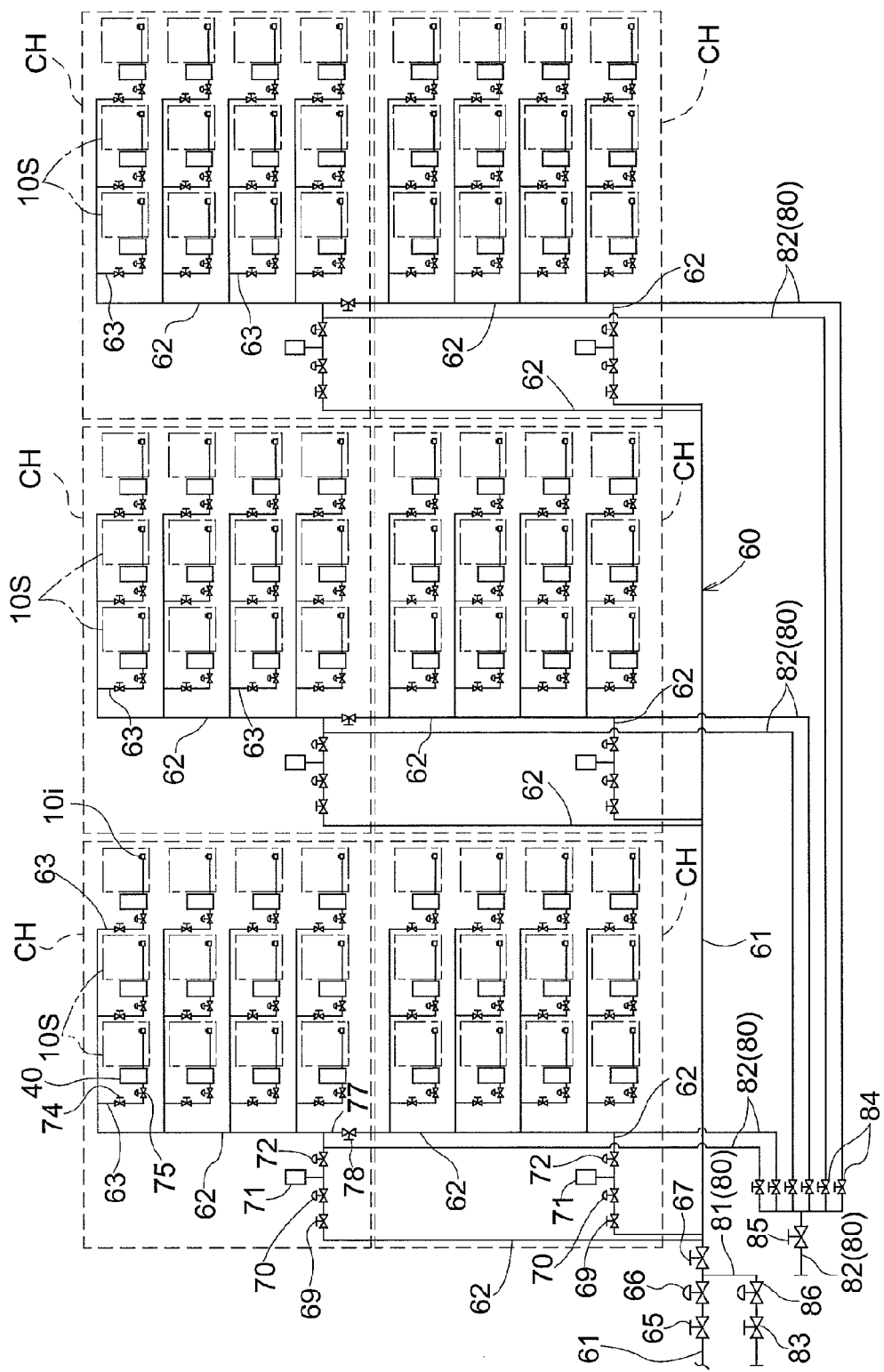
FIG. 5 shows how the inactive gas is supplied to different zones.

And as shown in FIG. 5, a total of 12 storage sections 10S located at 12 locations within four horizontal rows arranged with one located on top of another in the vertical direction, and three vertical columns arranged with one located next to another in the lateral direction are designated to belong to each zone CH so that the 72 storage sections 10S are divided into groups such that each storage section 10S belongs to one of the six zones CH. Thus, the plurality of storage sections 10S provided in the storage rack 10 are divided into a plurality of zones CH.

Figure 3:
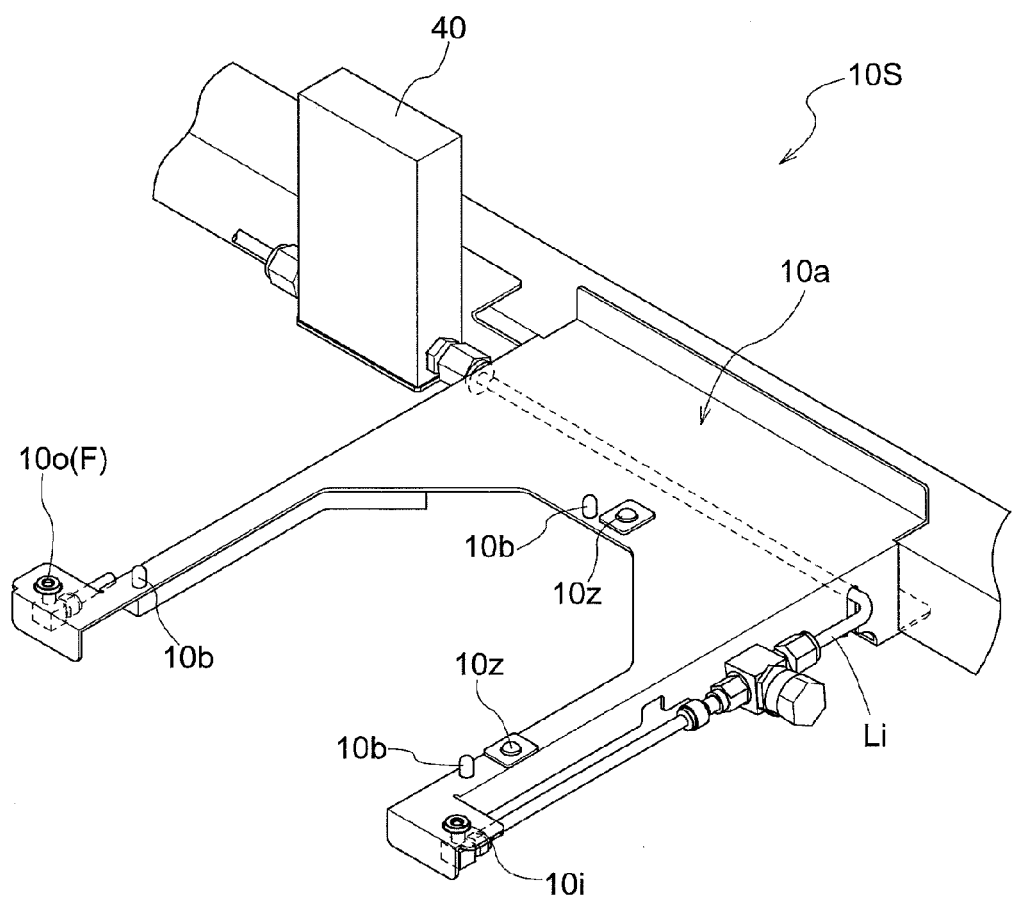
FIG. 3 is a perspective view of a storage section.

As shown in FIG. 3, each of the plurality of storage sections 10S has a receiving support portion 10$a$ for receiving and supporting a container 50 so that the storage section 10S stores the container 50 with the container 50 received and supported by the receiving support portion 10$a$.

The receiving support portion 10$a$ is provided with three positioning projections 10$b$ for engaging engaged portions (not shown) formed in the undersurface of the container 50 to properly position the container 50 in a predetermined position, and the two load presence sensors 10$z$ for detecting whether a container 50 is placed on the receiving support portion 10$a$ (i.e., whether the container 50 is stored in the storage section 10S).

In addition, as shown in FIGS. 3 and 4, the receiving support portion 10$a$ is provided with an inject nozzle 10$i$ which functions as an inject portion for injecting nitrogen gas into the interior of the container 50 stored in the storage section 10S, and a discharging gas passage body 10o for allowing passage of the gas to be discharged from the interior of the container 50.

As shown in FIG. 4, the inject nozzle 10i is provided at a location at which the gas supply opening 50i provided to the undersurface portion of the container 50 fits onto the inject nozzle 10i when the container 50 is placed at the predetermined position on the receiving support portion 10a whereas the discharging gas passage body 10o is provided at a location at which the discharge opening 50o provided to the undersurface portion of the container 50 fits onto the discharging gas passage body 10o when the container 50 is placed at the predetermined position on the receiving support portion 10a.

In other words, when the container 50 is stored in the storage section 10S and placed on the receiving support portion 10a, the container 50 is properly positioned in the horizontal direction by the positioning projections 10b in a predetermined position, and the inject nozzle 10i fits into and is connected to the gas supply opening 50i whereas the discharging gas passage body 10o fits into and is connected to the discharge opening 50o.

And with the container 50 received and supported by the receiving support portion 10a, nitrogen gas is injected into the interior of the container 50 through the gas supply opening 50i of the container 50 by causing the nitrogen gas to be injected from the inject nozzle 10i at a pressure which is greater than the atmospheric pressure by a value greater than or equal to a set value, so that the gas in the container 50 is caused to be discharged, or removed, to the outside through the discharge opening 50o of the container 50.

The discharging gas passage body 10o is connected to the discharge opening 50o so that the gas in the container 50 is discharged through the discharge opening 50o and the discharging gas passage body 10o out to the storage section 10S in which the container 50 is stored. In addition, the gas in the container 50 is also discharged from the gap between the container 50 and the lid 52 out to the storage section 10S.

And the discharge opening 50o and the discharging gas passage body 10o define a discharge portion F. And when the nitrogen gas is injected from the inject nozzle 10i and into the interior of the container 50 stored in the storage section 10S, this discharge portion F allows the gas inside the container 50 (air, nitrogen gas, etc. which remained in the container 50) to be discharged to the outside of the container 50. The inject nozzle 10i and the discharging gas passage body 10o is provided to each of the storage section 10S.

Also, the discharge opening 50o is considered to be provided to the storage section 10S by virtue of the fact that the container 50 to which the discharge opening 50o is provided is stored in the storage section 10S. In other words, the discharge portion F (the discharging gas passage body 10o and the discharge opening 50o) is provided to each of the storage section 10S.

(Structure for Supplying Nitrogen Gas)

As shown in FIG. 5, the storage facility has nitrogen gas supply passages 60 which function as inactive gas supply passages for supplying nitrogen gas to the plurality of storage sections 10S. In the present example, this nitrogen gas supply passages 60 are provided only to one of the pair of storage racks 10, and supply nitrogen gas only to that storage rack 10. The nitrogen gas supply passages 60 are described next.

The nitrogen gas supply passages 60 include a base supply portion 61, a plurality of zone supply portions 62, and a plurality of storage section supply portions 63. The plurality of zone supply portions 62 branch off from the base supply portion 61 to respective ones of the plurality of zones CH, and supply the nitrogen gas that passes, or flows, through the base supply portion 61 to the respective ones of the plurality of zones CH. The plurality of storage section supply portions 63 supply the nitrogen gas that passes through a zone supply portion 62 individually to respective ones of the plurality of storage sections 10S belonging to the zone CH corresponding to the zone supply portion 62 to cause the nitrogen gas to be injected from the inject nozzle 10i. In other words, the nitrogen gas supply passage 60 allows the nitrogen gas to pass, or flow, from a supply source (not shown), the base supply portion 61, a zone supply portion 62, and a storage section supply portion 63 in that order, and causes the nitrogen gas to be injected from the inject nozzle 10i.

The base supply portion 61 has a first manually operated base portion valve 65, a base portion control valve 66, and a second manually operated base portion valve 67, in that order from the upstream side with respect to the gas supplying direction. Each of the zone supply portions 62 has a manually operated zone valve 69, a pressure regulating valve 70, a pressure sensor 71, and a zone control valve 72 in that order from the upstream side with respect to the gas supplying direction. Each storage section supply portion 63 has a manually operated storage section valve 74, a storage section control valve 75, and a mass flow controller 40 in that order from the upstream side with respect to the gas supplying direction. And the inject nozzle 10i is connected to the downstream end of the storage section supply portion 63.

As shown in FIG. 5, with the plurality of zone supply portions 62 divided into groups with two zone supply portions in each group, a bypass passage 77 is provided to allow communication between the two zone supply portions in each group. And a manually operated bypass valve 78 is provided to each bypass passage 77.

As shown in FIG. 5, nitrogen gas relief passages 80 that are connected to the nitrogen gas supply passage 60 for discharging nitrogen gas from the nitrogen gas supply passage 60 are provided. And provided as these nitrogen gas relief passages 80 are a base portion relief passage 81 connected to the base supply portion 61 for discharging nitrogen gas from the base supply portion 61, and zone relief passages 82 connected to respective ones of the plurality of zone supply portions 62 for discharging nitrogen gas from the zone supply portions 62.

The base portion relief passage 81 has a relief pressure regulating valve 86, and a manually operated base portion relief valve 83, in that order from the upstream side with respect to the gas supplying direction. The zone relief passages 82 have manually operated zone relief valves 84 (one for each zone relief passage 82) and a manually operated merged relief valve 85.

Incidentally, each of the first manually operated base portion valve 65, the second manually operated base portion valve 67, the manually operated zone valve 69, the manually operated storage section valve 74, the manually operated bypass valve 78, the manually operated base portion relief valve 83, and the manually operated zone relief valve 84, and the manually operated merged relief valve 85 is a manually operated valve that can be operated by a worker between its closed state (or closed position) and its open state (or closed position). Each of the base portion control valve 66, the zone control valve 72, and the storage section control valve 75 is a control valve which can be operated to be switched between an open state (or closed position) and a closed state (or closed position) based on a control command from the controller H.

Each of the pressure regulating valve 70 and the relief pressure regulating valve 86 adjusts the pressure of the nitrogen gas on the downstream side by adjusting the supply rate of the passing nitrogen gas.

Note that, in describing the nitrogen gas supply passage 60, the direction in which nitrogen gas passes, or flows, toward the inject nozzle 10i from the supply source is referred to as the gas supplying direction, and the description is given using the terms, upstream and downstream, with respect to the gas supplying direction as they are defined in terms of the flow of inactive gas in the gas supplying direction.

Also, in describing the nitrogen gas relief passages 80, the direction in which the nitrogen gas from the nitrogen gas supply passage 60 passes, or flows, is referred to as the gas discharge direction, and the description is given using the terms, upstream and the downstream, with respect to the gas discharge direction as they are defined in terms of the flow of inactive gas in the gas discharge direction.

(Control Related Arrangements)

Figure 6:
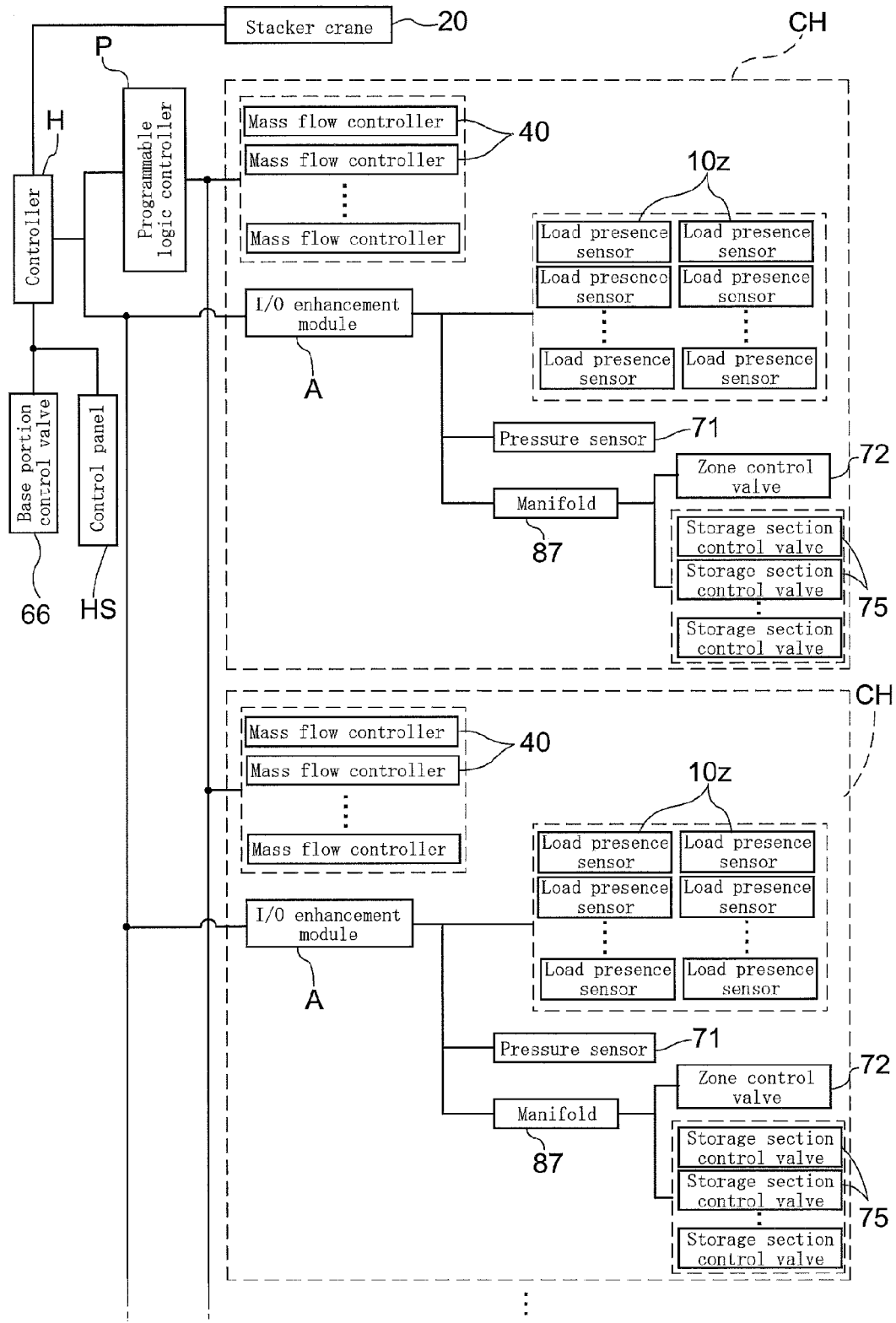
FIG. 6 is a control block diagram.

As shown in FIG. 6, detected information from the load presence sensors 10z is inputted into the controller H, which is also connected to the stacker crane 20 for mutual communication. This allows the controller H to manage, or keep track of, among other things, the storage status of the containers 50 in the storage rack 10, etc., and also to control operation of the stacker crane 20 based on a carry in command and a carry out command from a superordinate controller (not shown).

To describe in more detail, when the controller H receives a carry in command from the superordinate controller, it performs a carry in transport process. In the carry in transport process, the controller H selects, as the target storage section 10S for storage and based on the storage status, one of the storage sections 10S that is an empty storage section 10S in which no container 50 is stored, and that is managed or designated as a supply storage section (described later), and controls operation of the stacker crane 20 to transport the container 50 from the carry in and out conveyor CV to the target storage section 10S.

Also, when the controller H receives a carry out command from the superordinate controller, it performs a carry out transport process. In the carry out transport process, the controller H controls operation of the stacker crane 20 to transport a target container 50 to be carried out from the storage section 10S in which the target container 50 is stored, to the carry in and out conveyor CV.

As shown in FIG. 6, a programmable logic controller P and a plurality of I/O enhancement modules A are connected to the controller H by communication lines for mutual communication. A plurality of mass flow controllers 40 are connected to the programmable logic controller P. Connected to each I/O enhancement module A are the load presence sensors 10z, the pressure sensor 71, and a manifold 87, that belong to the corresponding zone CH.

And the controller H controls operation of the base portion control valve 66, transmits command information to the mass flow controllers 40 through the programmable logic controller P, and transmits command information to the manifold 87 through the I/O enhancement modules A. Thus, the controller H monitors the supply state of the nitrogen gas for the plurality of storage sections 10S by controlling the mass flow controllers 40 by transmitting command information to each of the plurality of mass flow controllers 40. That is, the controller H performs a supply state monitoring step of monitoring the supply state of the nitrogen gas for the plurality of storage sections 10S, and an adjusting device controlling step in which the controller H controls the plurality of mass flow controllers 40.

Each manifold 87 operates based on command information from the controller H, and operates the zone control valve 72 and the storage section control valves 75 to supply nitrogen gas to the storage sections 10S that are targets of nitrogen gas supply.

Each mass flow controller 40 includes, or has a function of, a flow regulating valve which adjusts the flow rate of the nitrogen gas that flows through the internal passage (i.e., flow rate of the nitrogen gas injected from the inject nozzle 10i), as well as a flow rate sensor which detects the flow rate of the nitrogen gas that flows to the inject nozzle 10i from the storage section supply portion 63. And the mass flow controller 40 controls the flow regulating valve to adjust the flow rate of the nitrogen gas that flows in the internal passage to a target flow rate based on the command information from the programmable logic controller P, and the detected information from the flow rate sensor.

In the present embodiment, the mass flow controller 40 adjusts the flow rate of the nitrogen gas that flows in the internal passage between zero to 50 liters/minute. And the mass flow controller 40 utilized in the present embodiment can adjust the flow rate to the target flow rate commanded by the controller H very quickly (for example, in less than 1 second) over the total flow adjustable range. And each of the plurality of mass flow controllers 40 is provided on the downstream side (in the storage section supply portion 63) with respect to the gas supplying direction toward the inject nozzle 10i, and functions as a supply amount adjusting device which adjusts the amount of supply of the nitrogen gas to each inject nozzle 10i.

Thus, the controller H controls the operation of the base portion control valve 66, the zone control valves 72, the storage section control valves 75, and the mass flow controllers 40 through the programmable logic controller P, and the I/O enhancement modules A, etc.

(Target Flow Rates Set by the Controller H)

The target flow rates commanded to the mass flow controllers 40 by the controller H include a target flow rate for storage, a target flow rate for nozzle cleaning, and a target flow rate for cleaning. The target flow rate for storage is a target flow rate commanded to cause nitrogen gas to be injected into the interior of the container 50 with the container 50 stored in a storage section 10S. The target flow rate for nozzle cleaning is a target flow rate commanded to clean the inject nozzle 10i, before the container 50 is stored in the storage section 10S. The target flow rate for cleaning is a target flow rate commanded to clean the inject nozzle 10i and a supply pipe Li, etc. at the time of installation of the storage rack 10, or when replacing any apparatus provided along the nitrogen gas supply passage 60, etc.

Figure 7:
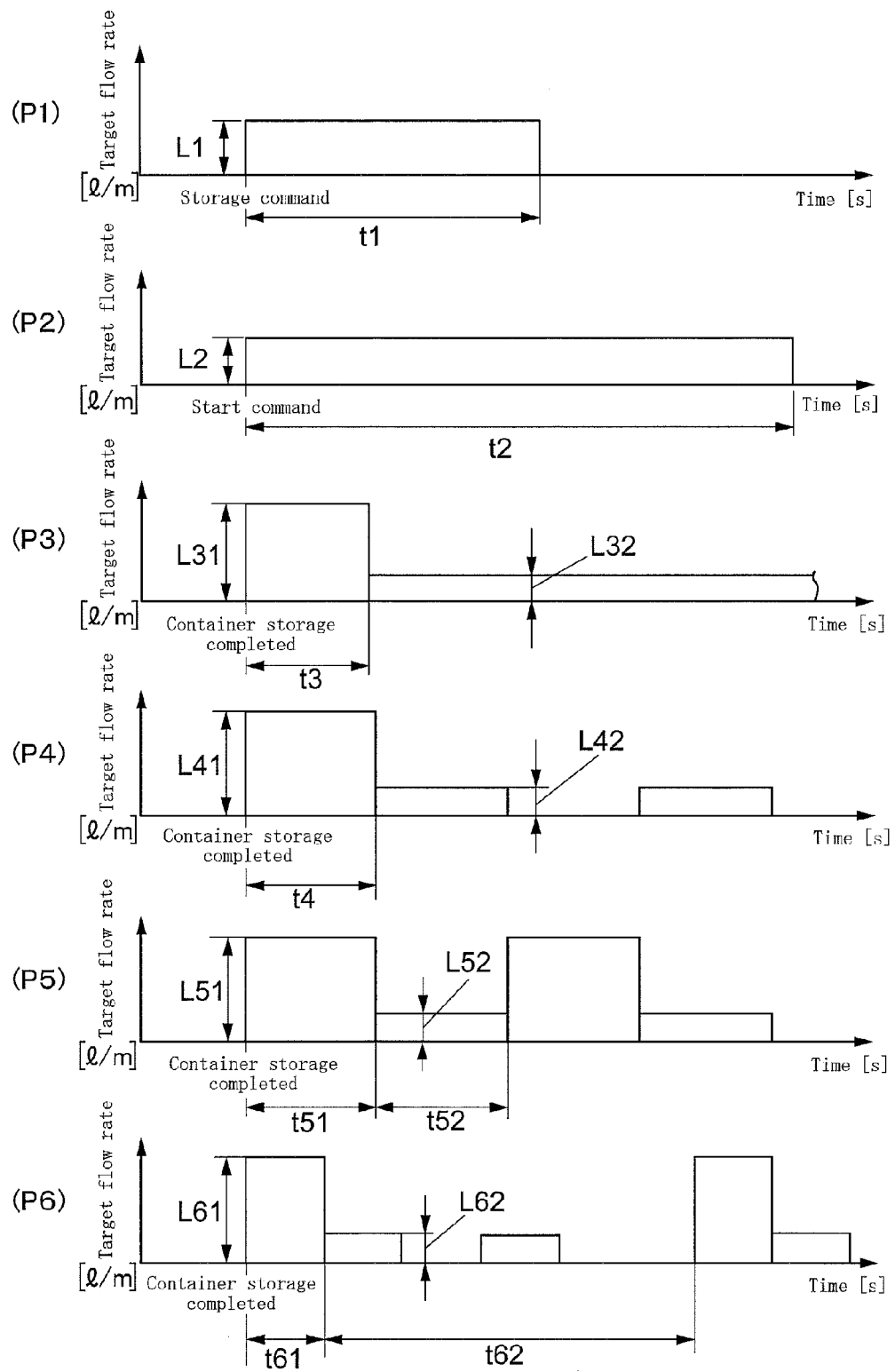
FIG. 7 is an explanatory drawing showing purge patterns of nitrogen gas.

As shown in FIG. 7, the plurality of purge patterns, which the controller H has stored in its memory, and each of which specifies the target flow rate and the supply period, include a nozzle purge pattern P1, a cleaning pattern P2, and four storage purge patterns P3-P6.

And the controller H is configured to command the target flow rate for cleaning (supply flow rate) in accordance with the cleaning pattern P2 when a cleaning start command is issued by means of the control panel HS, for example, at the time of installation of the storage rack 10.

Also, the controller H is configured to command the target flow rate for nozzle cleaning in accordance with the nozzle purge pattern P1 when a container 50 is carried into the installation space S by the carry in and out conveyor CV.

Further, when the two load presence sensors 10z detect a container 50, the controller H is configured to commanded the target flow rate for storage in accordance with one of the four storage purge patterns P3-P6 that has been selected in advance by means of the control panel HS.

(Purge Patterns)

Each of the nozzle purge pattern P1, the cleaning pattern P2, and the four storage purge patterns P3-P6 is described in more detail with reference to FIG. 7.

The nozzle purge pattern P1 is a pattern for supplying nitrogen gas at a target flow rate L1 that is set to be a target flow rate for nozzle cleaning, for a supply period t1 that is set to be a pre-storage supply period, from the time the container 50 is stored.

The supply period t1 is set to, for example, 5 seconds, and the target flow rate L1 is set to, for example, 30 liters/minute.

The cleaning pattern P2 is a pattern for supplying nitrogen gas at a target flow rate L2 that is set to be a target flow rate for cleaning for a supply period t2 that is set to be an installation initial supply period, from the time the cleaning start command is issued by means of the control panel HS.

The supply period t2 is set to, for example, 1800 seconds, and the target flow rate L2 is set to, for example, 20 liters/minute.

(Storage Purge Pattern)

An initial target flow rate, and a steady state target flow rate which is less than the initial target flow rate are defined for each of the four storage purge patterns P3-P6.

The initial target flow rate is set to, for example, 50 liters/minute, and the steady state target flow rate is set to, for example, 5 liters/minute. The initial target flow rate and the steady state target flow rate are set and changed by the worker.

And although the four storage purge patterns P3-P6 are similar in that the target flow rate for storage is set to the initial target flow rate first, and subsequently, the target flow rate for storage is changed to the steady state target flow rate, they are defined to be mutually different patterns.

The four storage purge patterns P3-P6 are respectively referred to hereinbelow as the first storage purge pattern P3, the second storage purge pattern P4, the third storage purge pattern P5, and as the fourth storage purge pattern P6, each of which is described in detail.

The first storage purge pattern P3 is a pattern in which nitrogen gas is initially supplied at a supply flow rate L31 defined as the initial target flow rate for a set supply period t3, and subsequently the nitrogen gas is continuously supplied at a supply flow rate L32 defined as the steady state target flow rate while the pair of load presence sensors 10z detect the presence of a container 50.

The second storage purge pattern P4 is a pattern in which nitrogen gas is initially supplied at a supply flow rate L41 defined as the initial target flow rate for a set supply period t4, and subsequently the nitrogen gas is intermittently supplied at a supply flow rate L42 defined as the steady state target flow rate while the pair of load presence sensors 10z detect the presence of a container 50.

The third storage purge pattern P5 is a pattern in which a cycle is repeated while the pair of load presence sensors 10z detect the presence of a container 50 with the cycle defined as initially supplying the nitrogen gas at a supply flow rate L51 defined as the initial target flow rate for a set supply period t51, and subsequently, supplying the nitrogen gas at a supply flow rate L52 defined as the steady state target flow rate, for a set supply period t52.

The fourth storage purge pattern P6 is a pattern in which a cycle is repeated while the pair of load presence sensors 10z detect the presence of a container 50 with the cycle defined as initially supplying the nitrogen gas at a supply flow rate L61 defined as the initial target flow rate for a set supply period t61, and subsequently, intermittently supplying the nitrogen gas at a supply flow rate L62 defined as the steady state target flow rate, for a set supply period t62.

(Supply Storage Sections and Stop Storage Sections)

The controller H manages the plurality of storage sections 10S by dividing the storage sections 10S into two groups: supply storage sections to which nitrogen gas is properly supplied; and stop storage sections to which nitrogen gas is not properly supplied, based on detected information from the programmable logic controller P, and input information from the control panel HS, etc.

By way of describing this in terms of a specific example, the pressure sensor 71 outputs the detected information to the programmable logic controller P. The programmable logic controller P transmits an abnormal pressure signal to the controller H if the pressure detected by the pressure sensor 71 deviates from the pressure specified by the command information by a value greater than or equal to a set pressure.

And based on the abnormal pressure signal from the programmable logic controller P, the controller H manages or designates, as stop storage sections, the storage sections 10S belonging to the zone CH that corresponds to the pressure sensor 71 at which the pressure abnormality has occurred.

In addition, a worker inputs permission information by means of the control panel HS when the worker determines that nitrogen gas can be properly supplied to the storage sections 10S that have been managed, or designated, as the stop storage sections after, for example, the pressure sensor 71 is replaced with a new pressure sensor 71. When permission information for the storage sections 10S that have been managed as stop storage sections is inputted by means of the control panel HS, the controller H manages or designates, as supply storage sections, the storage sections 10S that have previously been managed as stop storage sections.

In this manner, the controller H is configured to manage the storage sections 10S by dividing them into supply storage sections and stop storage sections with each zone CH taken as a unit, based on the information from the devices (the programmable logic controller P and the control panel HS in an example being described) that monitor and detect the supply state of nitrogen gas supplied to the zones CH. In addition, while no specific example is described, the controller H is also configured to manage the storage sections 10S by dividing them into supply storage sections and stop storage sections with each storage section 10S taken as a unit, based on the information from the devices that monitor and detect the supply state of nitrogen gas supplied to the storage sections 10S.

And as a general rule, the controller H performs a supply operation provided, or on the condition, that the container 50 is stored in a given storage section 10S. The controller H controls operation of the mass flow controller 40 in a supply operation to supply nitrogen gas to the given storage section 10S.

In this supply operation, for any one of the storage sections 10S being managed as a supply storage section, and when a container 50 is stored in the storage section 10S by the stacker crane 20, and the two load presence sensors 10z provided to the storage section 10S detect the container 50, the controller H commands, to the mass flow controller 40, a target flow rate for storage in accordance with one of the four storage purge patterns P3-P6 selected with the control panel HS in advance.

In addition, the controller H performs a supply stop process in which the operations of the mass flow controllers 40 are controlled to stop or suspend supply of the nitrogen gas to a part of or all of the plurality of storage sections 10S.

This supply stop process is performed when switching or changing the managing status of the storage sections 10S from supply storage sections to stop storage sections. In other words, when the managing status is changed to stop storage sections for the entire the storage rack 10 (all of the plurality of storage sections 10S), or with each zone CH taken as a unit, or with each storage section 10S taken as a unit (a part of the plurality of storage sections 10S), the controller H commands the mass flow controllers 40 to stop supplying at the target flow rate for storage, not only for the storage sections 10S in which no container 50 is stored but also for the storage sections 10S in each of which a container 50 is stored and in which nitrogen gas is supplied (to the container 50) in the supply operation.

In addition, after performing a supply stop process, the controller H performs a supply resume process in which operations of the mass flow controllers 40 are controlled to supply nitrogen gas to the storage sections 10S to which the supplying (of nitrogen gas) is to be resumed, among the storage sections 10S to which the supplying of nitrogen gas has been stopped in the supply stop process.

This supply resume process is performed when switching or changing the managing status of the storage sections 10S from stop storage sections to supply storage sections. In other words, when the managing status is changed to supplying state with the storage rack 10 taken as a unit, with each zone CH taken as a unit, or with each storage section 10S taken as a unit, the controller H takes, or designates, a part of, or all of, the storage sections 10S in each of which a container 50 is stored, as the storage sections 10S to which the supplying is to be resumed, and commands a target flow rate for storage in accordance with one of the four storage purge patterns P3-P6 selected with the control panel HS in advance to the mass flow controllers 40 that correspond to the storage sections 10S in each of which a container 50 is stored, and to which the supplying is to be resumed.

Incidentally, for example, when the controller H manages the storage sections 10S as the stop storage sections with each zone CH taken as a unit, and the managing status of the storage sections 10S belonging to a given zone CH is subsequently changed to supply storage sections, the supply resume process is performed so that the supplying of nitrogen gas is resumed for all the storage sections 10S which belong to that given zone CH and in each of which a container 50 is stored.

In such a case, there is a possibility that oxygen concentration may decrease locally because nitrogen gas (nitrogen gas at the initial target flow rate) is supplied in only one zone CH and gas in the containers 50 is discharged or released into the storage sections 10S as this happens. In order to avoid this from happening, the controller H monitors the supply state of the nitrogen gas supplied to the plurality of storage sections 10S, and controls the plurality of mass flow controllers 40 such that the storage sections 10S to which the supplying of inactive gas is resumed are not concentrated in one particular area.

To describe in more detail, the controller H monitors the supply state of nitrogen gas supplied to the plurality of storage sections 10S by dividing the plurality of storage sections 10S into a plurality of monitoring areas E with one monitoring area E defined for each group of storage sections which consists of two or more storage sections 10S with one located next to another, and controls the plurality of mass flow controllers 40 (simultaneous purge inhibitory control) such that the supply state of the nitrogen gas supplied to the storage sections 10S (group of storage sections) belonging to each of the plurality of monitoring area E satisfies a set restricting condition defined in advance.

The simultaneous purge inhibitory control by the controller H is described next. Incidentally, this simultaneous purge inhibitory control is mainly performed when the supplying of nitrogen gas is resumed with each zone CH taken as a unit; however, this is sometimes performed when the supplying of nitrogen gas is resumed with each storage section 10S taken as a unit or when the supplying of nitrogen gas is started as a container 50 has just been stored in a storage section 10S. In addition, the simultaneous purge inhibitory control is sometimes performed when the supply flow rate of nitrogen gas is changed from the initial target flow rate to the steady state target flow rate as well as when the supply flow rate of nitrogen gas is changed from the steady state target flow rate to the initial target flow rate, for another storage section 10S.

(Simultaneous Purge Inhibitory Control)

A plurality of monitoring areas E are defined for the plurality of storage sections 10S. The plurality of monitoring areas E are described first.

Figure 8:
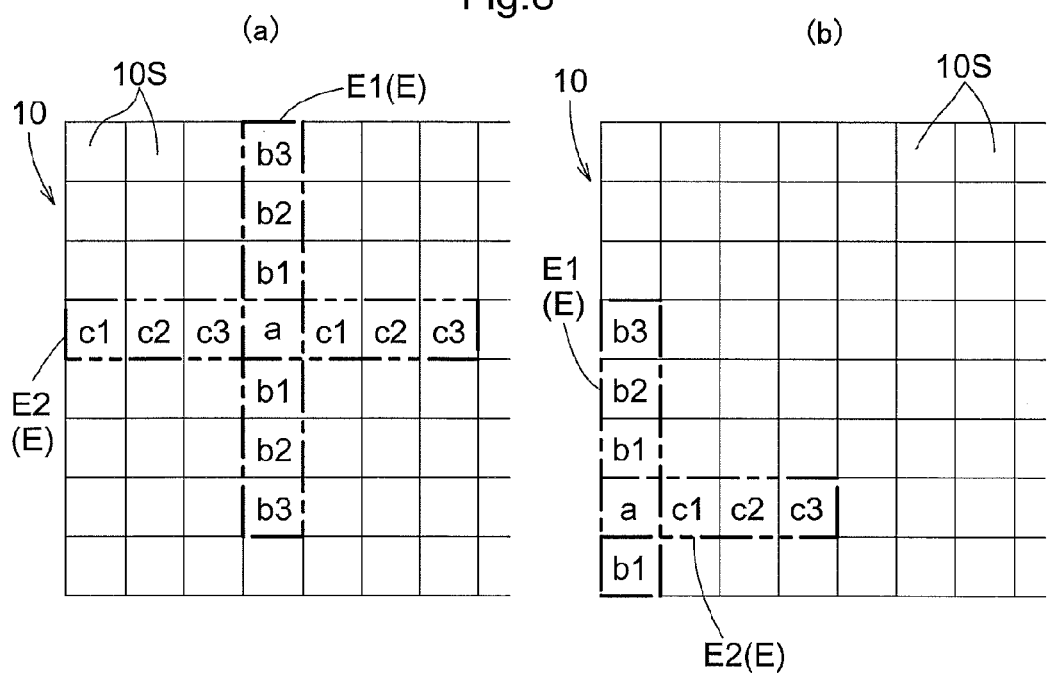
FIG. 8 shows a vertical monitoring area and a lateral monitoring area defined for the storage sections.
Figure 9:
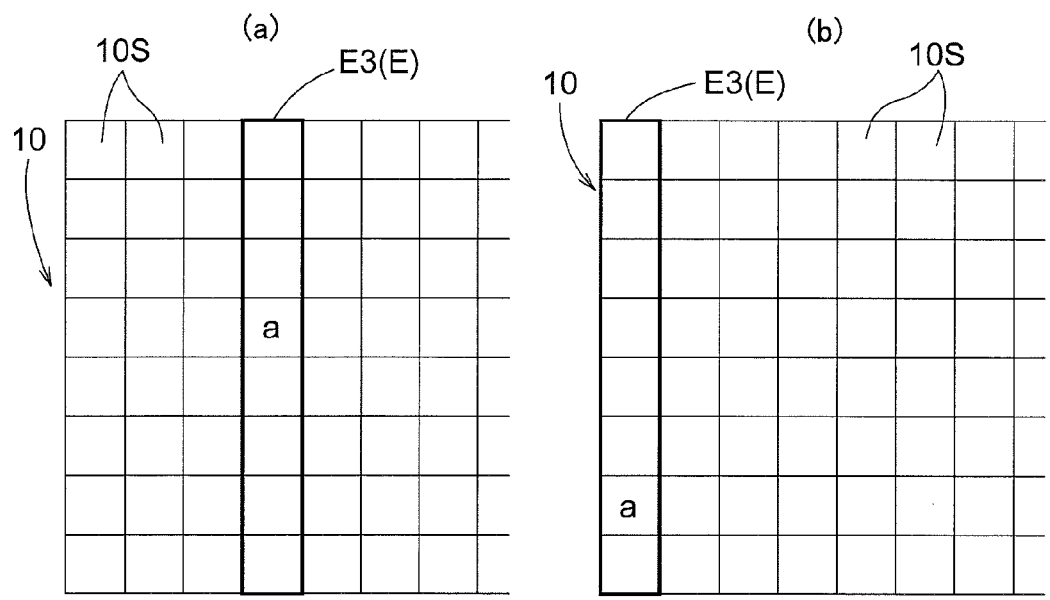
FIG. 9 shows a column monitoring area defined for the storage sections.

The monitoring areas E include vertical monitoring areas E1 each of which is formed of a group of storage sections with one located next to another in a line in the vertical direction (for example, area shown in FIG. 8 with dashed lines), lateral monitoring areas E2 each of which is formed of a group of storage sections with one located next to another in a line in the lateral direction (for example, area shown in FIG. 8 with double dashed lines), and column monitoring areas E3 each of which is formed of a group of storage sections with one located next to another in a line in the vertical direction and spanning the entire vertical dimension of the storage rack 10 (for example, area shown in FIG. 9 with thick lines).

Each of the vertical monitoring area E1 and the lateral monitoring area E2 is defined for each of the plurality of storage sections 10S so that 72 vertical monitoring areas E1 and 72 lateral monitoring areas E2 are defined for the 72 storage sections 10S. More specifically, a vertical monitoring area E1 and a lateral monitoring area E2 that are shown in FIG. 8 (*a*) are defined for the storage section 10S indicated by the reference symbol "a" in FIG. 8 (*a*). Similarly, a vertical monitoring area E1 and a lateral monitoring area E2 that are shown in FIG. 8 (*b*) are defined for the storage section 10S indicated by the reference symbol "a" in FIG. 8 (*b*). In the following description, when referring to the storage sections 10S illustrated in FIG. 8-FIG. 16, a storage section 10S indicated by a reference symbol "n" is referred to as the storage section 10S [n]. For example, the storage section 10S[a] means the storage section 10S that is indicated by the reference symbol "a". Each column monitoring area E3 is defined to correspond to each of the columns of the storage rack 10 so that nine column monitoring areas E3 are defined to correspond to the nine columns of the storage sections 10S. Each of the plurality of storage sections 10S belongs to one of the nine column monitoring areas E3.

Thus, each of the plurality of storage sections 10S belongs to each of the three kinds of monitoring areas E, namely, a vertical monitoring area E1, a lateral monitoring area E2, and a column monitoring area E3. And a plurality of the vertical monitoring areas E1, a plurality of the lateral monitoring areas E2, and a plurality of the column monitoring areas E3 thus defined are arranged along the direction (lateral direction) along which the worker passage T (see FIG. 1) extends. In addition, each of the vertical monitoring area E1, the lateral monitoring area E2, and the column monitoring area E3 is defined for a group of storage sections consisting of two or more storage sections 10S with one located next to another in at least one of the vertical direction and the lateral direction. And each vertical monitoring area E1 and each column monitoring area E3 are defined for a group of storage sections consisting of two or more storage sections 10S that are arranged in a vertical line and with one located next to another in the vertical direction.

And a set consecutive number and a set total number can be set by means of the control panel HS so that the areas of the vertical monitoring area E1 and the lateral monitoring area E2 can be changed by changing the value of the set consecutive number that is set. In other words, the set consecutive number is one of the parameters that define the vertical monitoring area E1 and the lateral monitoring area E2. And the set consecutive number and the position of the reference storage section 10S[a] determines the size and the position of the vertical monitoring area E1 and the lateral monitoring area E2.

More specifically, when the set consecutive number is set to the value "1", the vertical monitoring area E1 defined for the storage section 10S[a] is formed by the three storage sections 10S consisting of the storage section 10S[a] and the pair of storage sections 10S[b1] shown in FIGS. 8 (a) and 10.

When the set consecutive number is set to the value "2", the vertical monitoring area E1 defined for the storage section 10S[a] is formed by the five storage sections 10S consisting of the storage section 10S[a], the pair of storage sections 10S[b1], and the pair of storage sections 10S[b2] shown in FIGS. 8 (a) and 11.

When the set consecutive number is set to the value "3", the vertical monitoring area E1 defined for the storage section 10S[a] is formed by the seven storage sections 10S consisting of the storage section 10S[a], the pair of storage sections 10S[b1], the pair of storage sections 10S[b2], and the pair of storage sections 10S[b3] shown in FIGS. 8 (a) and 12.

Similarly, when the set consecutive number is set to the value "1", the lateral monitoring area E2 defined for the storage section 10S [a] is formed by the three storage sections 10S consisting of the storage section 10S[a] and the pair of storage sections 10S[c1] shown in FIGS. 8 (a) and 13.

When the set consecutive number is set to the value "2", the lateral monitoring area E2 defined for the storage section 10S [a] is formed by the five storage sections 10S consisting of the storage section 10S[a], the pair of storage sections 10S[c1], and the pair of storage sections 10S[c2] shown in FIGS. 8 (a) and 14.

When the set consecutive number is set to the value "3", the lateral monitoring area E2 defined for the storage section 10S[a] is formed by the seven storage sections 10S consisting of the storage section 10S[a], the pair of storage sections 10S[c1], the pair of storage sections 10S[c2], and the pair of storage sections 10S[c3] shown in FIGS. 8 (a) and 15.

Thus, in the present embodiment, the vertical monitoring area E1 and the lateral monitoring area E2 are basically formed by three, five, or seven storage sections 10S, the number of which is specified by the set consecutive number, with the reference storage section 10S[a] located at the center.

However, as shown in FIG. 8, the number of the storage sections 10S that belong to a monitoring area E is different depending on the position of the storage section 10S [a] as described next. Specifically, even when the set consecutive number is set to "3", the vertical monitoring area E1 and the lateral monitoring area E2 are sometimes formed by less than seven storage sections 10S (in FIG. 8 (b), the vertical monitoring area E1 is formed by five storage sections 10S whereas the lateral monitoring area E2 is formed by four storage sections 10S). Also, even when the set consecutive number is set to "2", the vertical monitoring area E1 and the lateral monitoring area E2 are sometimes formed by less than five storage sections 10S (in FIG. 8 (b), the vertical monitoring area E1 is formed by four storage sections 10S whereas the lateral monitoring area E2 is formed by three storage sections 10S). And, even when the set consecutive number is set to "1", the vertical monitoring area E1 and the lateral monitoring area E2 are sometimes formed by less than three storage sections 10S (in FIG. 8 (b), the lateral monitoring area E2 is formed by two storage sections 10S).

(Set Restricting Condition)

The set restricting condition is described next with reference to FIGS. 10-16. Each square shown in FIGS. 10-16 represents a storage section 10S. And squares representing the storage sections 10S that are completely shaded represent the storage sections 10S to which nitrogen gas is supplied. In addition, the storage section 10S[a] with a shaded circle represents a storage sections 10S to which the supplying (of nitrogen gas) is to be resumed.

Figure 10:
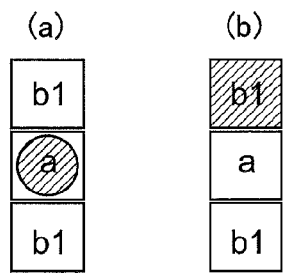
FIG. 10 shows the supply state of nitrogen gas supplied to a vertical monitoring area when the set consecutive number is 1.

Also, the outcome is the same when the states of the nitrogen gas supply at the initial target flow rate are inverted vertically (i.e., in FIG. 10 (b), when the bottom storage section 10S[b1] was the storage section 10S to which nitrogen gas is supplied and not the top storage section 10S[b1]) or reflected laterally (i.e., about a vertical line).

In addition, in the description of the set restricting condition below, for convenience, a storage section 10S is described to "become a storage section 10S to which the supplying is to be resumed" or a storage section 10S "does not become a storage section 10S to which the supplying is to be resumed" if only one kind of the monitoring areas E satisfies the set restricting condition; however, in reality, a storage section 10S becomes a storage section 10S to which the supplying is to be resumed if all of the three kinds of the monitoring areas E satisfy the set restricting condition.

The expression "storage section 10S to which nitrogen gas is supplied" above refers to the storage section 10S to which nitrogen gas is supplied at the initial target flow rate. And so a storage section 10S to which nitrogen gas is supplied at the steady state target flow rate is not a "storage section 10S to which nitrogen gas is supplied". Where there is no particular reference to the contrary is made in the following description, the expression "nitrogen gas is supplied" means "nitrogen gas is supplied at the initial target flow rate".

In the present embodiment, for a vertical monitoring area E1, the set restricting condition is that the number of the consecutive storage sections 10S in the vertical direction to which nitrogen gas is supplied is less than or equal to the set consecutive number.

When the set consecutive number is set to "1", then, even if nitrogen gas is supplied to the storage section 10S[a] as shown in FIG. 10 (a), the number of the consecutive storage sections 10S to which nitrogen gas is supplied would be less than or equal to the set consecutive number which is "1"; thus, the set restricting condition would be satisfied. Thus, in a case such as one shown in FIG. 10 (a), the storage section 10S[a] becomes a storage section 10S to which the supplying is to be resumed.

And when the set consecutive number is set to "1", then, if nitrogen gas was supplied to the storage section 10S[a] shown in FIG. 10 (b), the number of the consecutive storage sections 10S to which nitrogen gas is supplied would become greater than the set consecutive number which is "1"; thus, the set restricting condition would not be satisfied. Thus, in a case such as one shown in FIG. 10 (b), the storage section 10S[a] does not become a storage section 10S to which the supplying is to be resumed.

Figure 11:
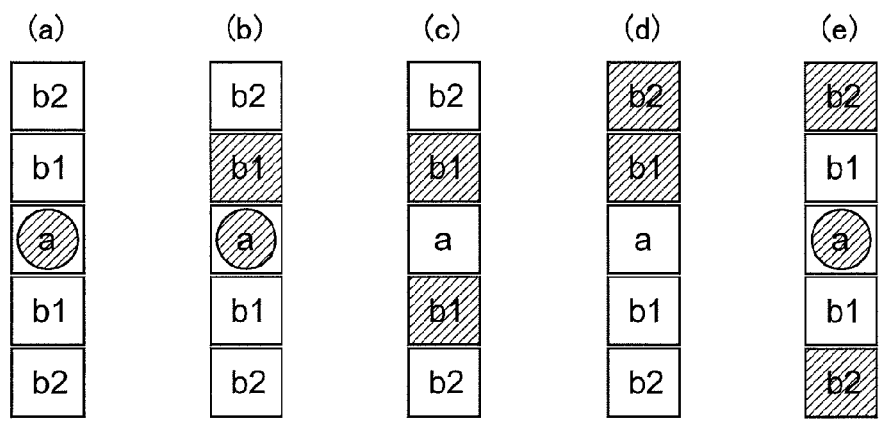
FIG. 11 shows the supply state of nitrogen gas supplied to a vertical monitoring area when the set consecutive number is 2.

When the set consecutive number is set to "2", then, even if nitrogen gas is supplied to the storage section 10S[a] shown in FIGS. 11 (a), (b), and (e), the number of the consecutive storage sections 10S to which nitrogen gas is supplied would be less than or equal to the set consecutive number which is "2"; thus, the set restricting condition would be satisfied. Thus, in cases such as ones shown in FIGS. 11 (a), (b), and (e), the storage section 10S[a] becomes a storage section 10S to which the supplying is to be resumed.

And when the set consecutive number is set to "2", then, if nitrogen gas was supplied to the storage section 10S[a] shown in FIGS. 11 (c), and (d), the number of the consecutive storage sections 10S to which nitrogen gas is supplied would become greater than the set consecutive number which is "2"; thus, the set restricting condition would not be satisfied. Thus, in cases such as ones shown in FIGS. 11 (c), and (d), the storage section 10S[a] does not become a storage section 10S to which the supplying is to be resumed.

Figure 12:
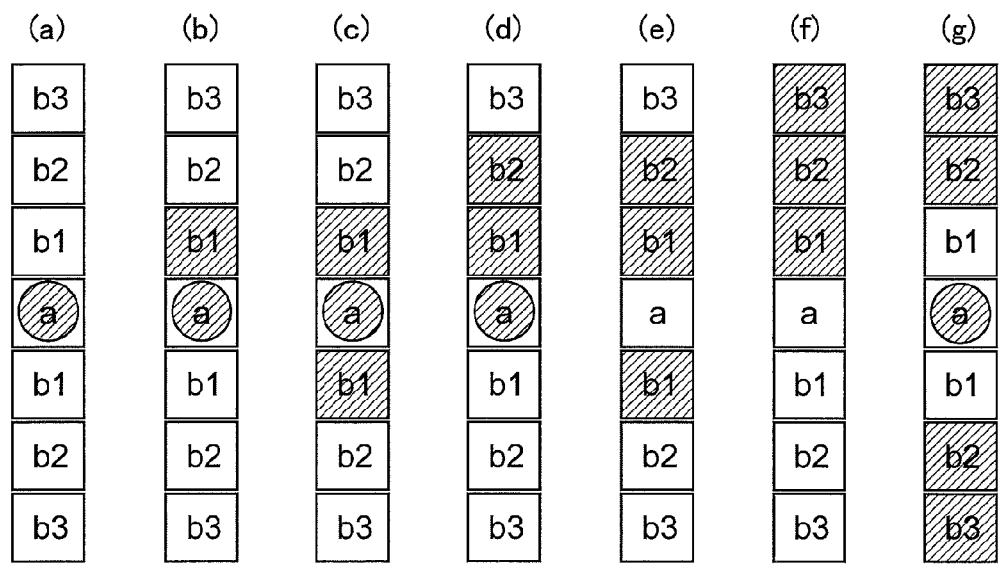
FIG. 12 shows the supply state of nitrogen gas supplied to a vertical monitoring area when the set consecutive number is 3.

When the set consecutive number is set to "3", then, even if nitrogen gas is supplied to the storage section 10S[a] shown in FIGS. 12 (a)-(d), and (g), the number of the consecutive storage sections 10S to which nitrogen gas is supplied would be less than or equal to the set consecutive number which is "3"; thus, the set restricting condition would be satisfied. Thus, in cases such as ones shown in FIGS. 12 (a)-(d), and (g), the storage section 10S[a] becomes a storage section 10S to which the supplying is to be resumed.

And when the set consecutive number is set to "3", then, if nitrogen gas was supplied to the storage section 10S[a] shown in FIGS. 12 (e), and (f), the number of the consecutive storage sections 10S to which nitrogen gas is supplied would become greater than the set consecutive number which is "3"; thus, the set restricting condition would not be satisfied. Thus, in cases such as ones shown in FIGS. 12 (e), and (f), the storage section 10S[a] does not become a storage section 10S to which the supplying is to be resumed.

In the present embodiment, for a lateral monitoring area E2, the set restricting condition is that the number of the consecutive storage sections 10S in the lateral direction to which nitrogen gas is supplied is less than or equal to the set consecutive number.

Figure 13:
FIG. 13 shows the supply state of nitrogen gas supplied to a lateral monitoring area when the set consecutive number is 1.
Figure 14:
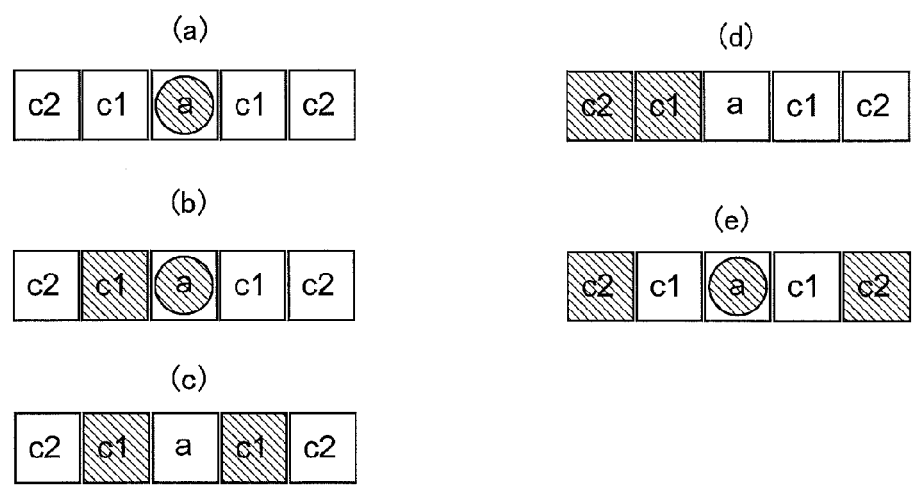
FIG. 14 shows the supply state of nitrogen gas supplied to a lateral monitoring area when the set consecutive number is 2.
Figure 15:
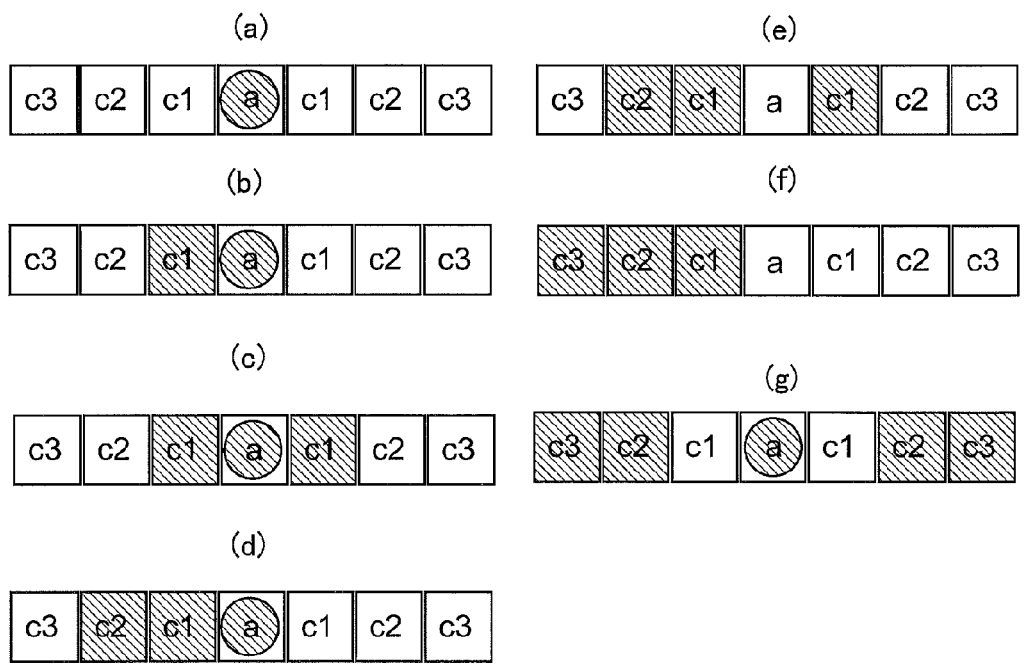
FIG. 15 shows the supply state of nitrogen gas supplied to a lateral monitoring area when the set consecutive number is 3.

The lateral monitoring areas E2 are different from the cases involving the vertical monitoring areas E1 only in the direction in which each of its groups of the storage sections extends; thus, specific descriptions with reference to FIGS. 13-15 are omitted here.

In the present embodiment, for column monitoring areas E, the set restricting condition is that the total number of the storage sections 10S which belong to any given column monitoring area E3 and to which nitrogen gas is supplied is less than or equal to the set total number.

This set restricting condition for the column monitoring areas E3 is defined in order to restrict the amount of the supplied nitrogen gas per unit time in any given column monitoring area E3 to less than or equal to a limit value defined in advance.

Figure 16:
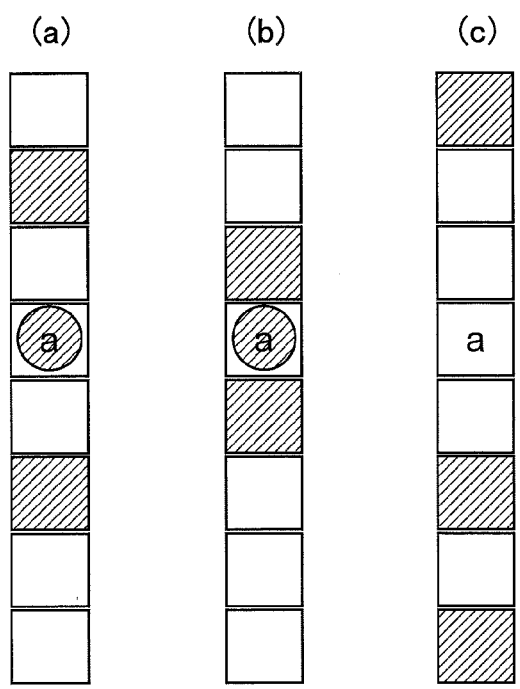
FIG. 16 shows the supply state of nitrogen gas supplied to a column monitoring area.

When the set total number is set to "3", then, even if nitrogen gas is supplied to the storage section 10S[a] as shown in FIGS. 16 (a), and (b), the total number of the storage sections 10S to which nitrogen gas is supplied would be less than or equal to the set total number which is "3"; thus, the set restricting condition would be satisfied. Thus, in cases such as ones shown in FIGS. 16 (a), and (b), the storage section 10S [a] becomes a storage section 10S to which the supplying is to be resumed.

When the set total number is set to "3", then, if nitrogen gas was supplied to the storage section 10S [a] shown in FIG. 16 (c), the total number of the storage sections 10S to which nitrogen gas is supplied would be greater than the set total number which is "3"; thus, the set restricting condition would not be satisfied. Thus, in a case such as one shown in FIG. 16 (c), the storage section 10S[a] does not become a storage section 10S to which the supplying is to be resumed.

(Selection of Storage Sections 10S to which the Supplying is to be Resumed)

In the supply resume process, the controller H selects, as the storage sections 10S to which the supplying (of the nitrogen gas) is to be resumed, a part of or all of the storage sections 10S from all of the storage sections 10S which can be storage sections 10 to which supplying is to be resumed, such that the set restricting condition is satisfied in the monitoring area E to which the storage sections 10S belong if the supplying of nitrogen gas, to the storage sections 10S to which the supplying is to be resumed, is actually resumed. In the supply resume process, when the managing status is changed to supply state taking each zone CH as a unit, for example, the storage sections 10S which belong to any given zone CH and in each of which a container 50 is stored are the storage sections 10S which can be the storage sections 10s to which the supplying is to be resumed. And among all of the storage sections 10S which can be the storage sections 10S to which the supplying is to be resumed, the storage sections 10S to which the supplying is to be resumed are selected such that the set restricting condition is satisfied for each monitoring area E.

In addition, the controller H manages, or keeps track of, elapsed time since the container 50 is stored, based on the detected information from the load presence sensors 10z, for each of the plurality of storage sections 10S, and in the supply resume process, selects or designates storage sections 10S as storage sections 10S to which the supplying is to be resumed by giving priority to the storage sections 10S for which the elapsed time is shorter (i.e., with shorter elapsed times) among all of the storage sections 10S which can be the storage sections 10S to which the supplying is to be resumed.

In other words, the controller H makes a determination, as to if the set restricting condition is satisfied by giving priority to the storage section 10S for which the elapsed time since the storing of the container 50 is shorter among all of the storage sections 10S which can be the storage sections 10S to which the supplying is to be resumed. Thus, determinations are made as to if the set restricting condition is satisfied by the storage sections 10S for which the elapsed time is shorter with few storage sections 10S to which nitrogen gas is supplied in the surrounding area. As a result, it is more probable for a storage section 10S with shorter elapsed time to be selected as the storage section 10S to which the supplying is to be resumed, and thus, to receive nitrogen gas.

Alternative Embodiments (1) In the embodiment described above, the supply stop process is performed after the supply operation is started, and the containers 50 are continued to be stored in the storage sections 10S to which these operations are performed until the supply resume process is subsequently started. However, when performing the supply stop process, the containers 50 may be removed from the storage sections 10S to which the operation is performed, and then may be returned to the storage sections 10S to which the supply resume process is performed before the supply resume process is started.

The containers 50 that are removed as described above may be transported to other storage sections 10S located in the same storage facility, or may be transported to storage sections 10S in another storage facility with the cooperation of the carry in and out conveyor CV and the transport vehicle D.

(2) In the embodiment described above, the controller H is configured to manage, or keep track of, the elapsed time since the storing of a container 50 for each of the plurality of storage sections 10S based on the detected information from the load presence sensors 10z provided to the storage sections 10S. However, the controller H may be configured to manage, or keeps track of, the elapsed time since the storing of the container 50 in the storage section 10S in which the container 50 is stored by calculating the elapsed time based on detected information from a sensor which detects that a container 50 is carried into the installation space S by the carry in and out conveyor CV. Or the controller H may be configured to manage, or keeps track of, the elapsed time since the container 50 is carried into the installation space S based on detected information from such a sensor. And the storage section 10S to which the supplying is to be resumed may be selected based on the elapsed time managed in this manner.

(3) In the embodiment described above, the set restricting condition for the vertical monitoring area E1 and the lateral monitoring area E2 is that the number of consecutive storage sections 10S to which inactive gas is supplied is less than or equal to the set consecutive number defined in advance, whereas the set restricting condition for the column monitoring area E3 is that the total number of the storage sections 10S to which inactive gas is supplied is less than or equal to the set total number defined in advance.

However, the set restricting condition for each kind of monitoring area E may be changed suitably. For example, the set restricting condition for the vertical monitoring area E may be that the total number of the storage sections 10S to which inactive gas is supplied is less than or equal to the set total number defined in advance.

Alternatively, the total supply amount which is the sum total of the amount of the inactive gas supplied per unit time to the storage sections 10S that belong to a given monitoring area E may be calculated for each monitoring area E. And the set restricting condition may be a condition that would restrict the total supply amount to less than or equal to a predetermined limit value.

(4) In the embodiment described above, three kinds of monitoring areas E, namely a vertical monitoring area E1, a lateral monitoring area E2, and a column monitoring area E3, for each of the plurality of storage sections 10S are defined; however, one kind or two kinds out of the three kinds of monitoring areas E may be defined for each of the plurality of storage sections 10S.

In addition, the monitoring areas E are defined for each of the plurality of storage sections 10S in the embodiment described above. However, the monitoring areas E may be defined for only a part of the plurality of storage sections 10S, for example, by defining only the column monitoring area E3 for the storage sections 10S in every other column.

(5) In the embodiment described above, an example is described in which each container 50 is a FOUP for storing semiconductor substrates; however, the invention is not limited to this arrangement. And, for example, the container 50 may be a reticle container for storing reticles. In addition, nitrogen gas is used as the inactive gas in the embodiment described above. However, various kinds of gas, other than the nitrogen gas, with low reactivity with the stored substrates W, such as gaseous argon etc., may be used as the inactive gas. Incidentally, a broad range of things, such as industrial products, food, medical supplies, etc. may be stored in the containers 50 as articles.

(6) In the embodiment described above, the inactive gas supply passages are provided only to one storage rack 10 between the pair of the storage racks 10 provided in the storage facility; however, the inactive gas supply passage may be provided to both of the storage racks 10. Incidentally, when providing the inactive gas supply passages to both of the storage racks 10 in this manner, a storage section 10S in one storage rack 10 and a storage section 10S of the other storage rack 10 that face each other may be treated as two storage sections 10S that are next to each other and may form a monitoring area E.

(7) In the embodiment described above, the mass flow controller 40 functions as a supply amount adjusting device; However, a supply amount adjusting device may be provided as a separate device. For example, the supply amount adjusting device may be the storage section control valve 75.

(8) In the embodiment described above, the walls K are provided to cover the installation space S in which the plurality of storage sections 10S are installed. However, the installation space S may be open space without the walls K, so that the inactive gas in the installation space S may be stirred or dispersed by allowing external air to move into the installation space S.

(9) In the embodiment described above, the discharge portion F is formed by the discharge opening 50o and the discharging gas passage body 10o. However, the inactive gas in the container may be discharged out directly from the discharge opening 50o provided to the container 50 so that the discharge opening 50o provided to the container 50 stored in the storage section 10S would become the discharge portion F provided to the storage section 10S.

(10) In the embodiment described above, the controller H is configured to monitor the supply state of the nitrogen gas for the plurality of storage sections 10S by transmitting command information to each of the plurality of supply amount adjusting devices to control the supply amount adjusting devices. However, the controller H may be configured to monitor the supply state of the nitrogen gas for the plurality of storage sections 10S by transmitting command information to each of the plurality of supply amount adjusting devices to control the supply amount adjusting devices and further by the controller H receiving the supply information of inactive gas from the supply amount adjusting devices.

(11) With respect to these and other arrangements, and structures, the embodiments disclosed in the present specification are provided only as examples in every respect, and the scope of the present invention is not limited by these embodiments. And various suitable changes and modifications can be made without departing from the spirit of the present invention. Therefore, any other embodiment with changes and modifications made without departing from the spirit of the present invention would naturally fall within the scope the present invention.

What is claimed is:

1. A storage facility comprising:
   a plurality of storage sections for storing containers;
   inactive gas supply passages for supplying inactive gas to respective ones of the plurality of storage sections;
   an inject portion provided to each of the plurality of storage sections for injecting inactive gas supplied from the corresponding inactive gas supply passage to an interior of the container stored in the corresponding storage section;
   a discharge portion provided to each of the plurality of storage sections for discharging gas within the corresponding container to outside the corresponding container when the inactive gas is injected from the inject portion to the interior of the container stored in the corresponding storage section;
   a plurality of supply amount adjusting devices, each of which is provided on an upstream side, in the corresponding inactive gas supply passage, of the corresponding inject portion of a corresponding one of the plurality of storage sections, for adjusting a supply amount of the inactive gas to the corresponding inject portion;
   a controller for monitoring a supply state of the inactive gas for the plurality of storage sections and for controlling the plurality of supply amount adjusting devices;
   wherein the controller is configured to monitor the supply state of the inactive gas for the plurality of storage sections by dividing the plurality of storage sections into a plurality of monitoring areas defined for each of groups of storage sections each of which consists of two or more storage sections with one located next to another, and to control the plurality of supply amount adjusting devices such that the supply state of the inactive gas supplied to the storage sections belonging to each of the plurality of monitoring areas satisfies a set restricting condition defined in advance;
   wherein the controller is configured:
      to perform a supply process in which the corresponding supply amount adjusting device is controlled to supply inactive gas to the corresponding storage section provided that the container is stored in the corresponding storage section;
      to perform a supply stop process in which the supply amount adjusting devices are controlled to stop supplying of the inactive gas to a part of or all of the plurality of storage sections; and
      to perform, after performing the supply stop process, a supply resume process in which the supply amount adjusting devices are controlled to supply the inactive gas to the corresponding storage sections to which the supplying of the inactive gas is to be resumed among the storage sections to which the supplying of inactive gas has been stopped in the supply stop process;
   wherein, in the supply resume process, a part of or all of the storage sections are selected, as storage sections to which the supplying is to be resumed, from all the storage sections which can be the storage sections to which the supplying is to be resumed, such that the set restricting condition is satisfied in the monitoring area that the storage sections to which the supplying is to be resumed belong to if the supplying of the inactive gas is resumed to the storage sections to which the supplying is to be resumed; and
   wherein the controller is configured to manage elapsed time since storing of the corresponding container, for each of the plurality of storage sections, and to select, in the supply resume process, the storage sections to which the supplying is to be resumed from all the storage sections which can be the storage sections to which the supplying is to be resumed by giving priority to the storage sections for which the elapsed time is shorter.

2. The storage facility as defined in claim 1, wherein the set restricting condition is a condition defined to restrict a supply amount of the inactive gas per unit time in each of the monitoring areas to less than or equal to a limit value defined in advance.

3. The storage facility as defined in claim 1,
   wherein a passage for a worker is provided adjacent to the plurality of storage sections, and
   wherein the plurality of monitoring areas are defined such that more than one of the monitoring areas are arranged in the direction along which the passage for the worker extends.

4. The storage facility as defined in claim 1,
   wherein the plurality of storage sections are provided such that more than one storage sections are arranged in each of a vertical direction and a lateral direction, and
   wherein each of the monitoring areas is defined for the group of storage sections which consists of two or more storage sections with one located next to another in at least one of the vertical direction and the lateral direction.

5. The storage facility as defined in claim 4, wherein each of the monitoring areas is defined for the group of storage sections which consists of two or more storage sections with one located next to another in a line in the vertical direction.

6. The storage facility as defined in claim 4, wherein the set restricting condition is that a total number of the storage sections to which inactive gas is supplied in each of the monitoring areas is less than or equal to a set total number defined in advance.

7. The storage facility as defined in claim 4, wherein the set restricting condition is that a number of consecutive storage sections to which the inactive gas is supplied in at least one of the vertical direction and the lateral direction is less than or equal to a set consecutive number defined in advance.

8. The storage facility as defined in claim 1, wherein walls are provided to enclose installation space in which the plurality of storage sections are installed.

9. A storage method utilizing a storage facility including,
   a plurality of storage sections for storing containers;
   inactive gas supply passages for supplying inactive gas to respective ones of the plurality of storage sections;
   an inject portion provided to each of the plurality of storage sections for injecting inactive gas supplied from the corresponding inactive gas supply passage to an interior of the container stored in the corresponding storage section;
   a discharge portion provided to each of the plurality of storage sections for discharging gas within the corresponding container to outside the corresponding container when the inactive gas is injected from the inject portion to the interior of the container stored in the corresponding storage section;

a plurality of supply amount adjusting devices, each of which is provided on an upstream side, in the corresponding inactive gas supply passage, of the corresponding inject portion of a corresponding one of the plurality of storage sections, for adjusting a supply amount of the inactive gas to the corresponding inject portion; and a controller;

the storage method comprising the following steps that are performed by the controller;

a supply state monitoring step in which a supply state of the inactive gas is monitored, for the plurality of storage units;

an adjusting device controlling step in which the plurality of supply amount adjusting devices are controlled;

wherein, in the supply state monitoring step, the supply state of the inactive gas for the plurality of storage sections is monitored by dividing the plurality of storage sections into a plurality of monitoring areas defined for each of groups of storage sections each of which consists of two or more storage sections with one located next to another, wherein, in the adjusting device controlling step, the plurality of supply amount adjusting devices are controlled such that the supply state of the inactive gas supplied to the storage sections belonging to each of the plurality of monitoring areas satisfies a set restricting condition defined in advance, wherein in the adjusting device controlling step, the following processes are performed:

a supply process in which the corresponding supply amount adjusting device is controlled to supply inactive gas to the corresponding storage section provided that the container is stored in the corresponding storage section;

a supply stop process in which the supply amount adjusting devices are controlled to stop supplying of the inactive gas to a part of or all of the plurality of storage sections; and after performing the supply stop process, a supply resume process in which the supply amount adjusting devices are controlled to supply the inactive gas to the corresponding storage sections to which the supplying of the inactive gas is to be resumed among the storage sections to which the supplying of inactive gas has been stopped in the supply stop process, wherein, in the supply resume process, a part of or all of the storage sections are selected, as storage sections to which the supplying is to be resumed, from all the storage sections which can be the storage sections to which the supplying is to be resumed, such that the set restricting condition is satisfied in the monitoring area that the storage sections to which the supplying is to be resumed belong to if the supplying of the inactive gas is resumed to the storage sections to which the supplying is to be resumed, wherein the steps that are performed by the controller further includes an elapsed time managing step in which elapsed time since storing of the corresponding container is managed, for each of the plurality of storage sections, and wherein, in the supply resume process, the storage sections to which the supplying is to be resumed are selected from all the storage sections which can be the storage sections to which the supplying is to be resumed, by giving priority to the storage sections for which the elapsed time is shorter.

10. The storage method as defined in claim 9, wherein the set restricting condition is a condition defined to restrict a supply amount of the inactive gas per unit time in each of the monitoring areas to less than or equal to a limit value defined in advance.

11. The storage method as defined in claim 9,
wherein the storage facility has a passage for a worker, the passage being provided adjacent to the plurality of storage sections, and
wherein, in the supply state monitoring step, the plurality of the monitoring areas are defined such that more than one of the monitoring areas are arranged in the direction along which the passage for the worker extends.

12. The storage method as defined in claim 9,
wherein the plurality of storage sections are provided such that more than one storage sections are arranged in each of a vertical direction and a lateral direction, and
wherein, in the supply state monitoring step, each of the monitoring areas is defined for the group of storage sections which consists of two or more storage sections with one located next to another in at least one of the vertical direction and the lateral direction.

13. The storage method as defined in claim 12, wherein in the supply state monitoring step, each of the monitoring areas is defined for the group of storage sections which consists of two or more storage sections with one located next to another in a line in the vertical direction.

14. The storage method as defined in claim 12, wherein the set restricting condition is that a total number of the storage sections to which inactive gas is supplied in each of the monitoring areas is less than or equal to a set total number defined in advance.

15. The storage method as defined in claim 12, wherein the set restricting condition is that a number of consecutive storage sections to which the inactive gas is supplied in at least one of the vertical direction and the lateral direction is less than or equal to a set consecutive number defined in advance.

16. The storage method as defined in claim 9, wherein the storage facility includes walls that are provided to enclose installation space in which the plurality of storage sections are installed.

* * * * *

UNITED STATES PATENT AND TRADEMARK OFFICE
CERTIFICATE OF CORRECTION

PATENT NO. : 9,595,461 B2
APPLICATION NO. : 14/307955
DATED : March 14, 2017
INVENTOR(S) : Takahara et al.

Page 1 of 1

It is certified that error appears in the above-identified patent and that said Letters Patent is hereby corrected as shown below:

In the Claims

Column 27, Line 14, Claim 9, delete "controller;" and insert -- controller: --

Signed and Sealed this
Second Day of May, 2017

Michelle K. Lee
*Director of the United States Patent and Trademark Office*